(12) United States Patent
Isohata et al.

(10) Patent No.: US 12,388,402 B2
(45) Date of Patent: Aug. 12, 2025

(54) METHOD FOR MANUFACTURING OSCILLATOR

(71) Applicant: SEIKO EPSON CORPORATION, Tokyo (JP)

(72) Inventors: Kensaku Isohata, Minowa (JP); Katsuhiko Maki, Chino (JP)

(73) Assignee: SEIKO EPSON CORPORATION (JP)

( * ) Notice: Subject to any disclaimer, the term of this patent is extended or adjusted under 35 U.S.C. 154(b) by 65 days.

(21) Appl. No.: 18/475,296

(22) Filed: Sep. 27, 2023

(65) Prior Publication Data
US 2024/0106393 A1  Mar. 28, 2024

(30) Foreign Application Priority Data
Sep. 28, 2022  (JP) .................. 2022-154774

(51) Int. Cl.
*H03B 5/04* (2006.01)
*H03B 5/32* (2006.01)
(Continued)

(52) U.S. Cl.
CPC ............... *H03B 5/32* (2013.01); *H03B 5/04* (2013.01); *H03H 3/02* (2013.01); *H03H 9/0552* (2013.01);
(Continued)

(58) Field of Classification Search
CPC ... H03B 5/04; H03B 5/30; H03B 5/32; H03B 2200/0018; H03H 3/007; H03H 3/02;
(Continued)

(56) References Cited

U.S. PATENT DOCUMENTS

2003/0064694 A1  4/2003  Oka et al.
2009/0135472 A1*  5/2009  Kato ............... G02B 26/105
                                                257/E21.214
(Continued)

FOREIGN PATENT DOCUMENTS

JP  2009-232150 A  10/2009
JP  2020-120159 A  8/2020
(Continued)

*Primary Examiner* — Levi Gannon
(74) *Attorney, Agent, or Firm* — Harness, Dickey & Pierce, P.L.C.

(57) ABSTRACT

A method for manufacturing oscillators of a plurality of types including a first oscillator and a second oscillator, the method includes: manufacturing the first oscillator, the manufacturing the first oscillator including a first-oscillator first step of mounting, to a first container, a first resonator element and a first circuit element configured to oscillate the first resonator element to generate a first oscillation signal, and a first-oscillator second step of mounting, to the first container, a second resonator element whose oscillation frequency is controlled based on the first oscillation signal; and manufacturing the second oscillator, the manufacturing the second oscillator including a second-oscillator first step of mounting a third resonator element and a second circuit element to a second container of the same type as the first container, the third resonator element being of the same type as the first resonator element and the second circuit element being of the same type as the first circuit element and being configured to oscillate the third resonator element to generate a second oscillation signal, and a second-oscillator second step of mounting, to the second container, a fourth resonator element whose oscillation frequency is controlled based on the second oscillation signal and whose frequency is different from the frequency of the second resonator element.

9 Claims, 14 Drawing Sheets

(51) Int. Cl.
    *H03H 3/02*    (2006.01)
    *H03H 9/05*    (2006.01)
    *H03H 9/08*    (2006.01)
    *H03H 9/10*    (2006.01)
    *H03H 9/205*   (2006.01)
    *H03L 1/02*    (2006.01)
    *H03L 1/04*    (2006.01)
    *H03H 3/04*    (2006.01)

(52) U.S. Cl.
    CPC .............. *H03H 9/08* (2013.01); *H03H 9/10* (2013.01); *H03H 9/205* (2013.01); *H03L 1/028* (2013.01); *H03L 1/04* (2013.01); *H03B 2200/0018* (2013.01); *H03B 2201/038* (2013.01); *H03H 2003/0471* (2013.01)

(58) Field of Classification Search
    CPC ...... H03H 9/0547; H03H 9/0552; H03H 9/08; H03H 9/10; H03H 9/205; H03H 2003/0471; H03L 1/04; H03L 1/028
    See application file for complete search history.

(56) References Cited

U.S. PATENT DOCUMENTS

2009/0236936 A1   9/2009   Tamura
2020/0235701 A1   7/2020   Nomura
2023/0065998 A1   3/2023   Isohata

FOREIGN PATENT DOCUMENTS

JP   2023-031988 A    3/2023
WO   2003-021765 A1   3/2003

* cited by examiner

METHOD FOR MANUFACTURING OSCILLATOR

The present application is based on, and claims priority from JP Application Serial Number 2022-154774, filed Sep. 28, 2022, the disclosure of which is hereby incorporated by reference herein in its entirety.

BACKGROUND

1. Technical Field

The present disclosure relates to a method for manufacturing an oscillator.

2. Related Art

An oven-controlled crystal oscillator (OCXO) disclosed in JP-A-2020-120159 includes a first container accommodating a first resonator element and a first circuit element configured to oscillate the first resonator element to generate a first oscillation signal. A second container accommodating a second resonator element whose oscillation frequency is controlled based on the first oscillation signal is mounted at a lower surface of the first container.

As such an oven-controlled crystal oscillator, it is required to efficiently manufacture a plurality of types of oscillators, to which the second resonator element having a different characteristic is mounted, at low cost.

SUMMARY

A method for manufacturing an oscillator according to the present disclosure is a method for manufacturing oscillators of a plurality of types including a first oscillator and a second oscillator, the method including: manufacturing the first oscillator, the manufacturing the first oscillator including a first-oscillator first step of mounting, to a first container, a first resonator element and a first circuit element configured to oscillate the first resonator element to generate a first oscillation signal, and a first-oscillator second step of mounting, to the first container, a second resonator element whose oscillation frequency is controlled based on the first oscillation signal; and manufacturing the second oscillator, the manufacturing the second oscillator including a second-oscillator first step of mounting a third resonator element and a second circuit element to a second container of the same type as the first container, the third resonator element being of the same type as the first resonator element and the second circuit element being of the same type as the first circuit element and being configured to oscillate the third resonator element to generate a second oscillation signal, and a second-oscillator second step of mounting, to the second container, a fourth based on the second oscillation signal and whose frequency is different from the frequency of the second resonator element.

DESCRIPTION OF EMBODIMENTS

Figure 1:
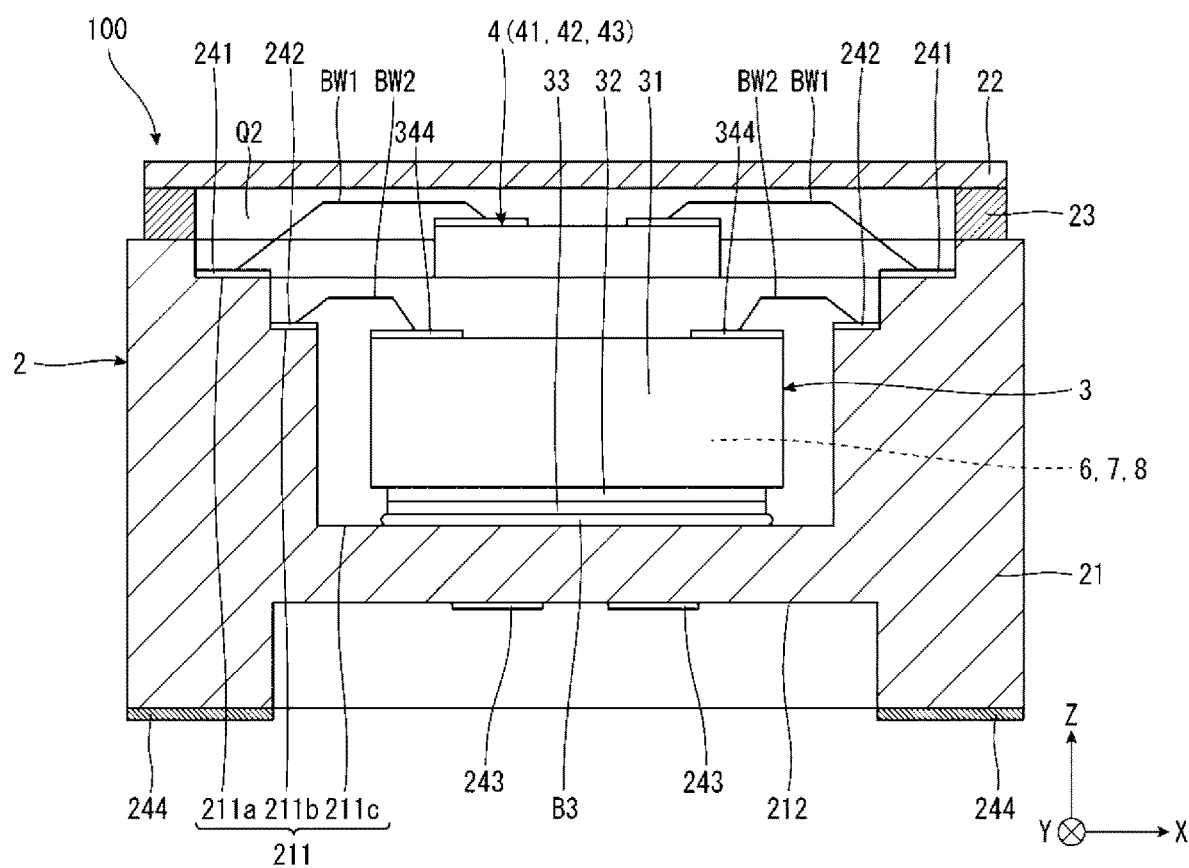
FIG. 1 is a cross-sectional view illustrating a common package according to a first embodiment.

Hereinafter, preferred embodiments of a method for manufacturing an oscillator according to the present disclosure will be described in detail with reference to the accompanying drawings. For convenience of description, an X-axis, a Y-axis, and a Z-axis orthogonal to one another are illustrated in the drawings. Hereinafter, a direction along the X-axis is also referred to as an "X-axis direction", a direction along the Y-axis is also referred to as a "Y-axis direction", and a direction along the Z-axis is also referred to as a "Z-axis direction". A side indicated by an arrow of each axis is also referred to as a "positive side", and an opposite side thereof is also referred to as a "negative side". The positive side in the Z-axis direction is also referred to as "upper". The negative side in the Z-axis direction is also referred to as "lower". Further, a plan view from the Z-axis direction is also simply referred to as a "plan view".

First Embodiment

Figure 2:
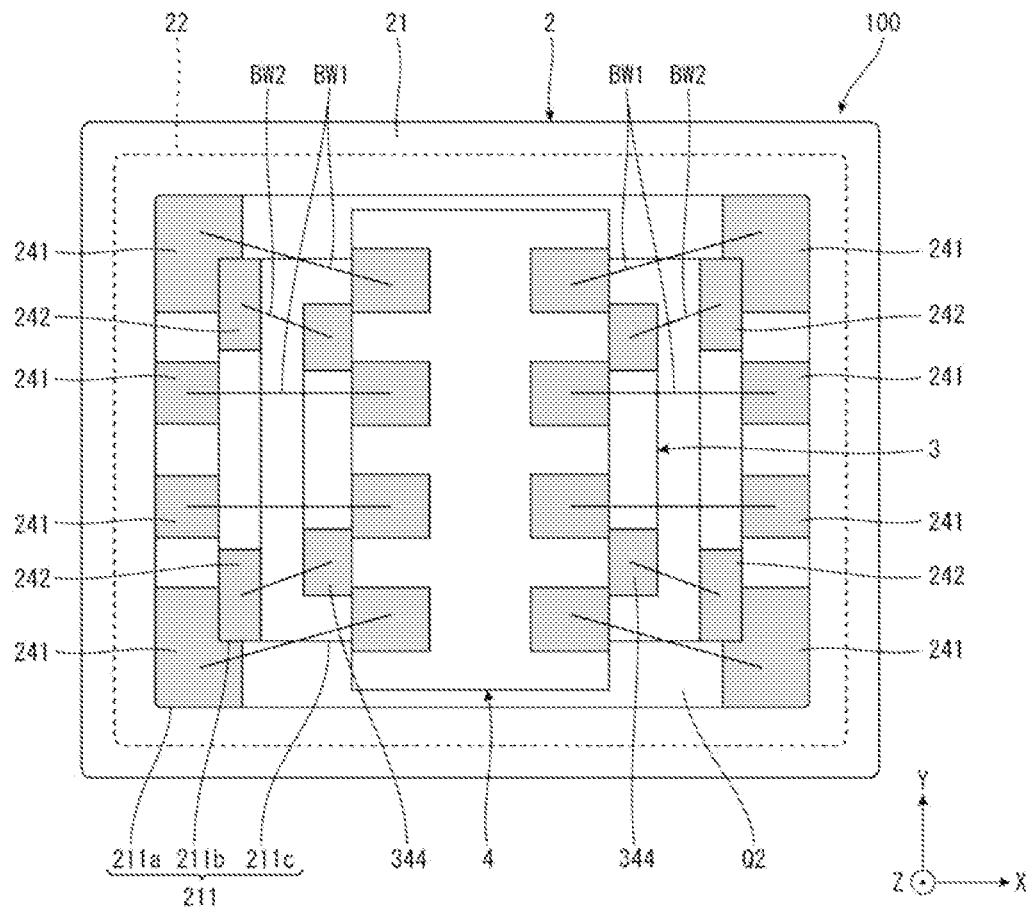
FIG. 2 is a plan view of the common package as viewed from above.
Figure 3:
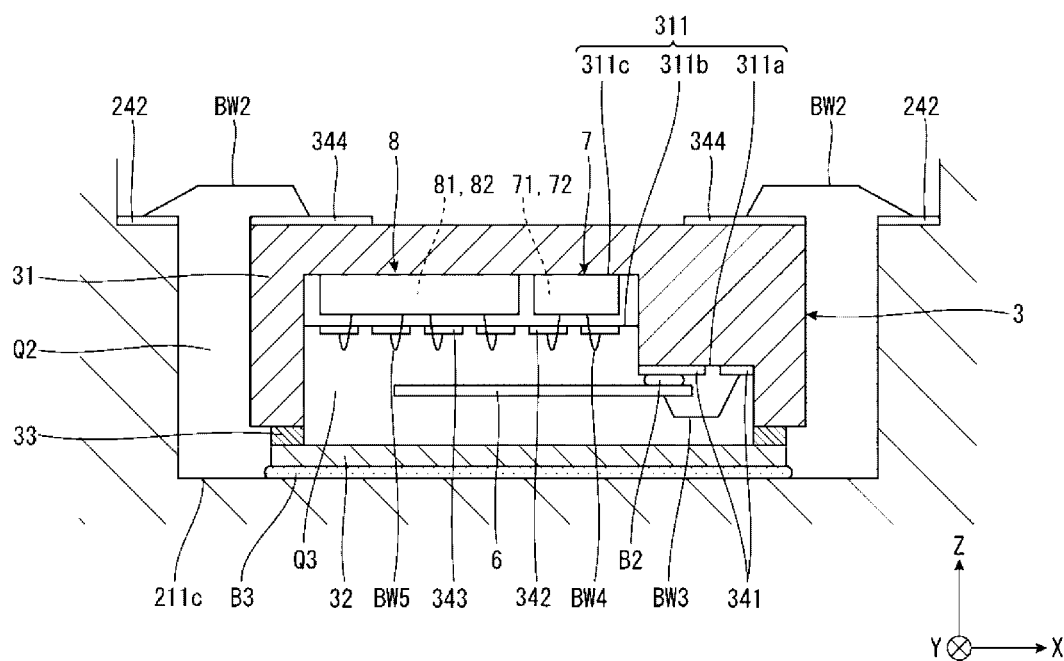
FIG. 3 is a cross-sectional view illustrating an inner package of the common package and an inner portion thereof.
Figure 4:
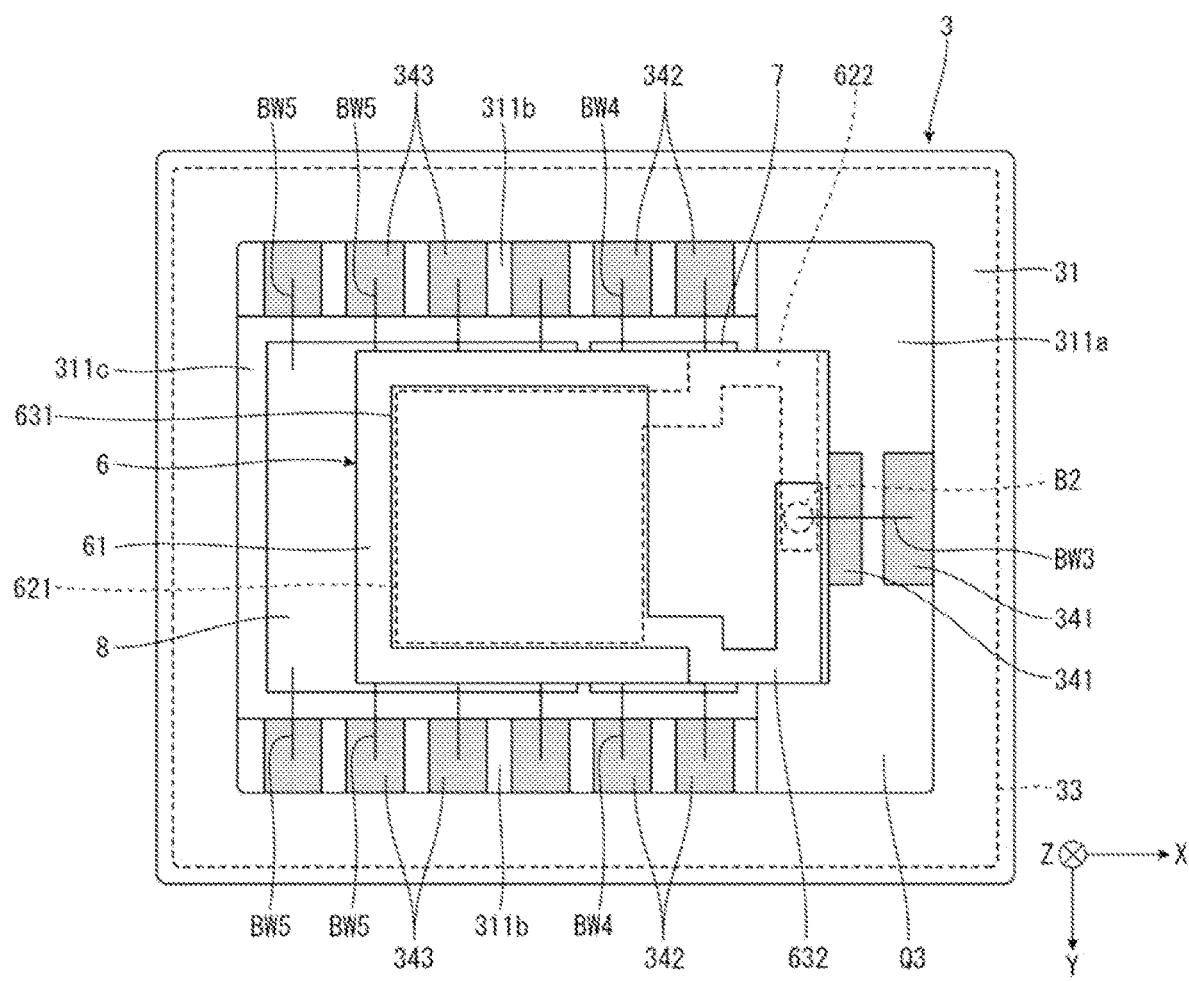
FIG. 4 is a plan view of the inner package as viewed from below.
Figure 5:
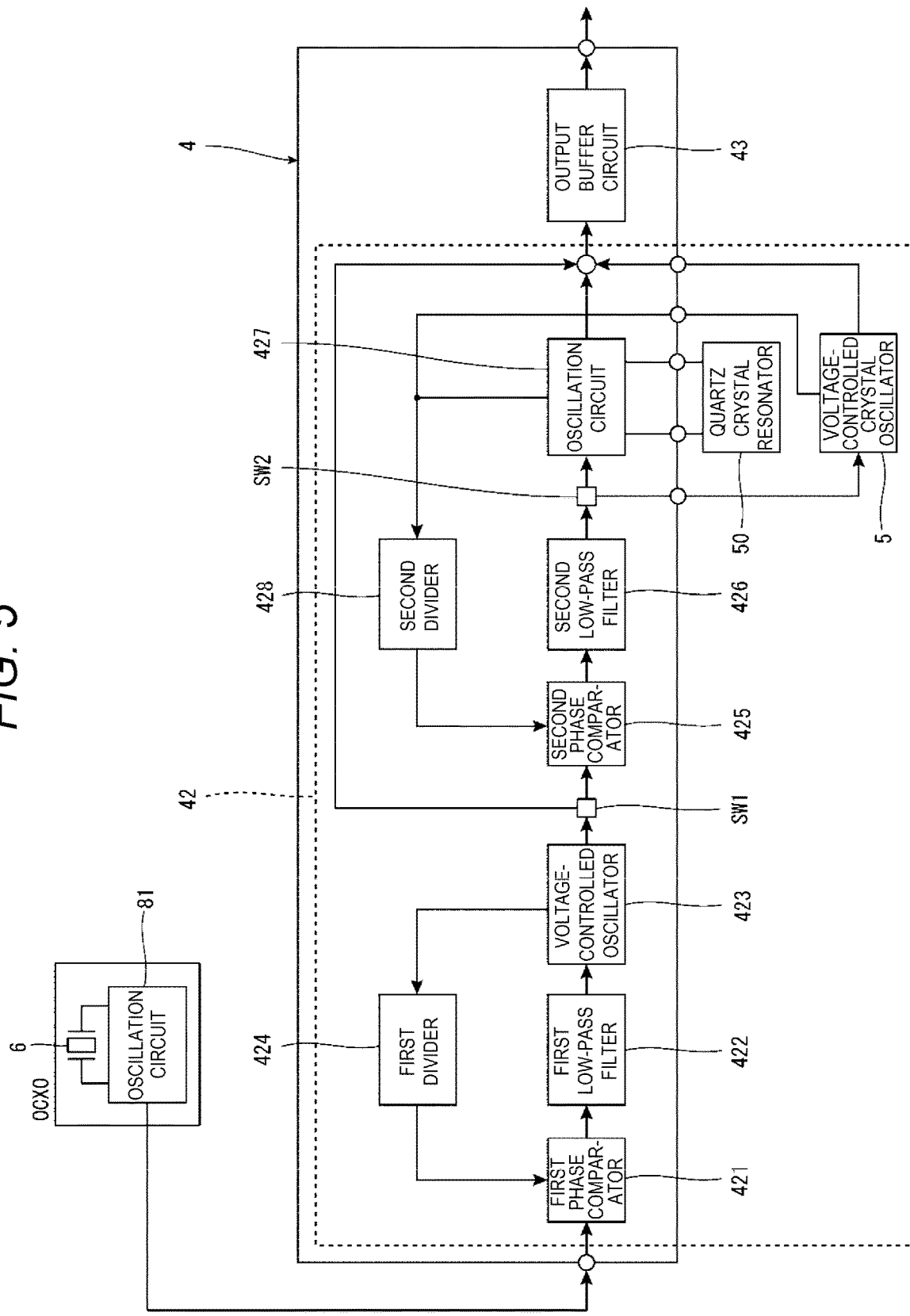
FIG. 5 is a circuit diagram illustrating a PLL circuit provided in a circuit element of the common package.
Figure 6:
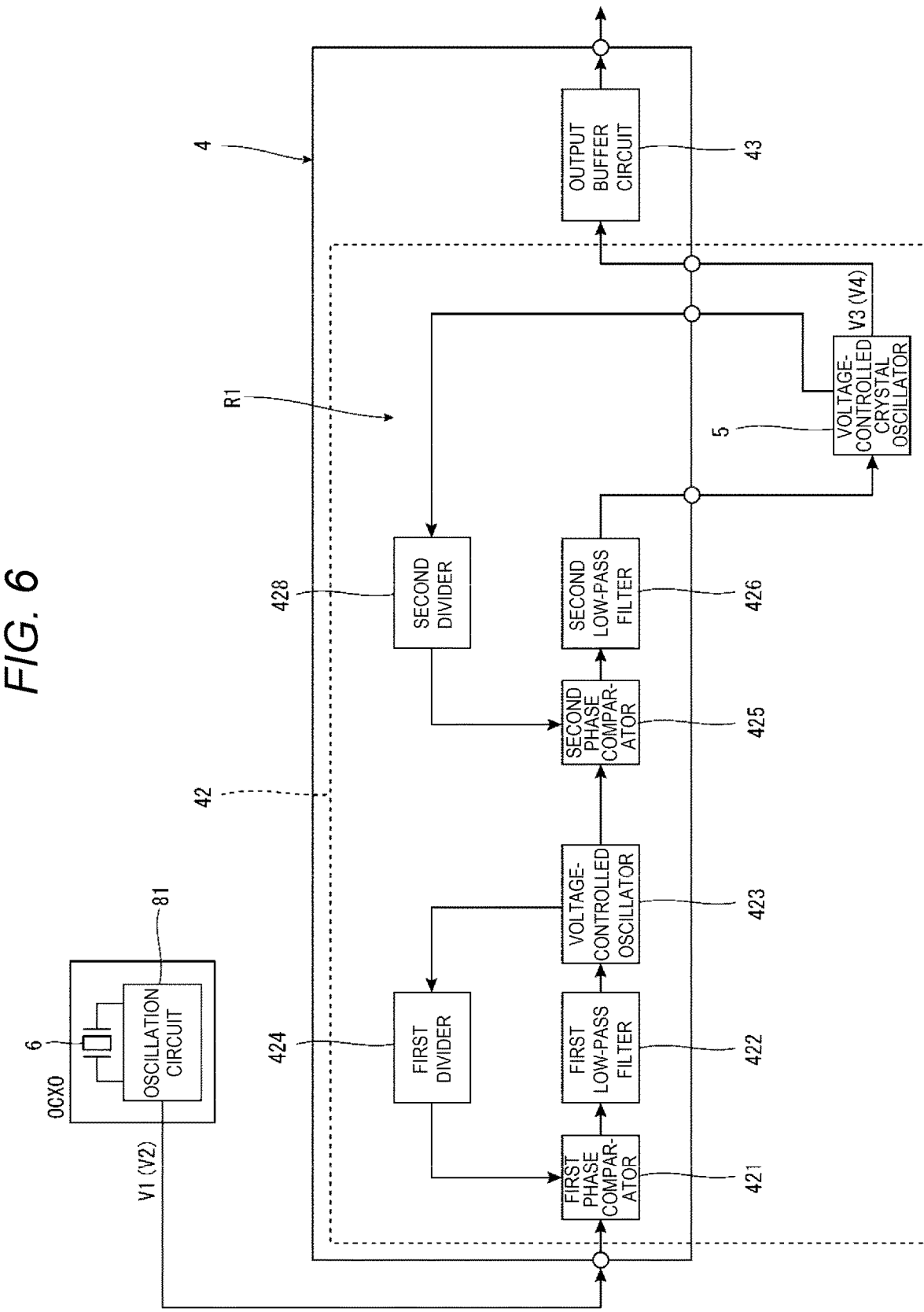
FIG. 6 is a circuit diagram illustrating a first route of the PLL circuit.
Figure 7:
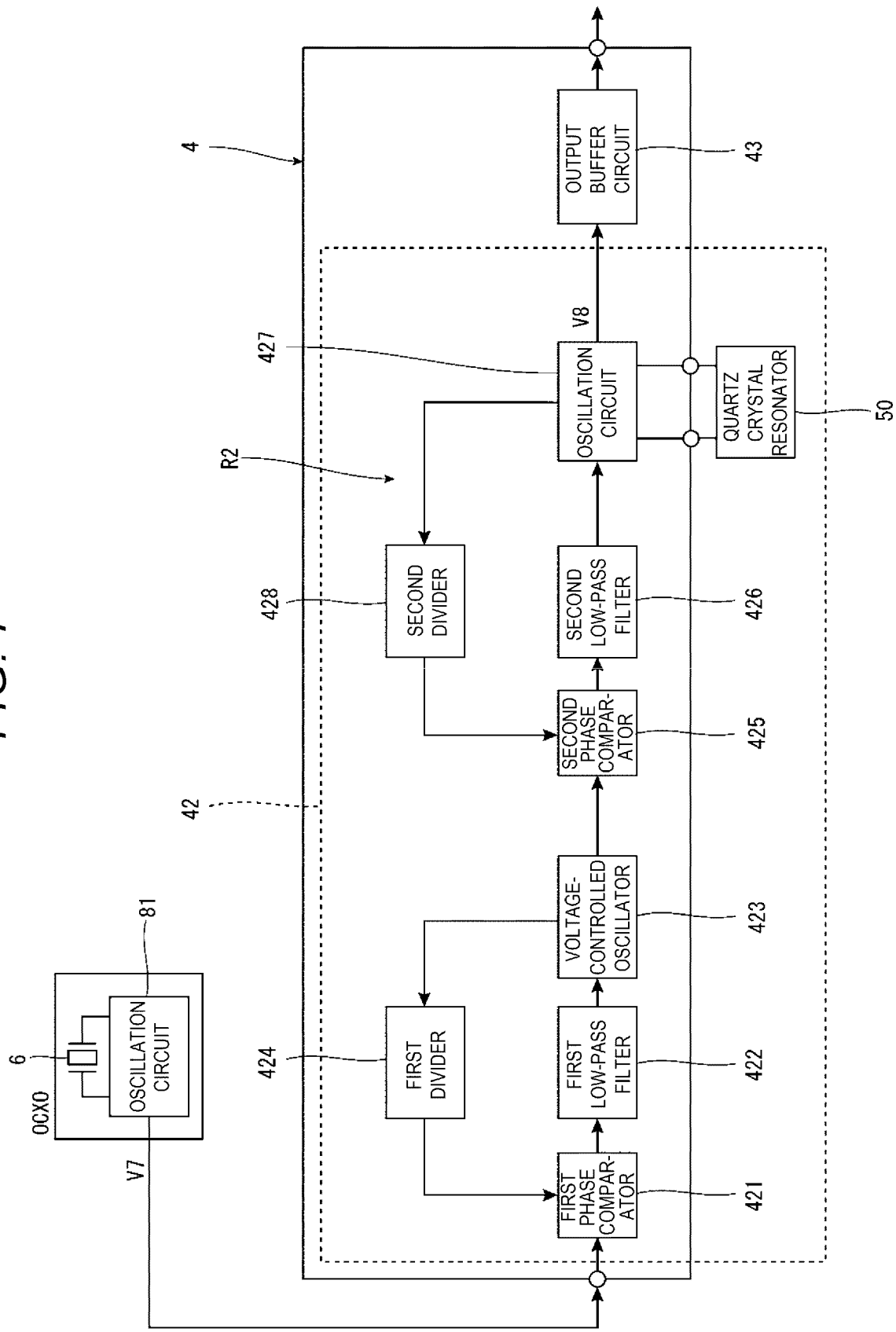
FIG. 7 is a circuit diagram illustrating a second route of the PLL circuit.
Figure 8:
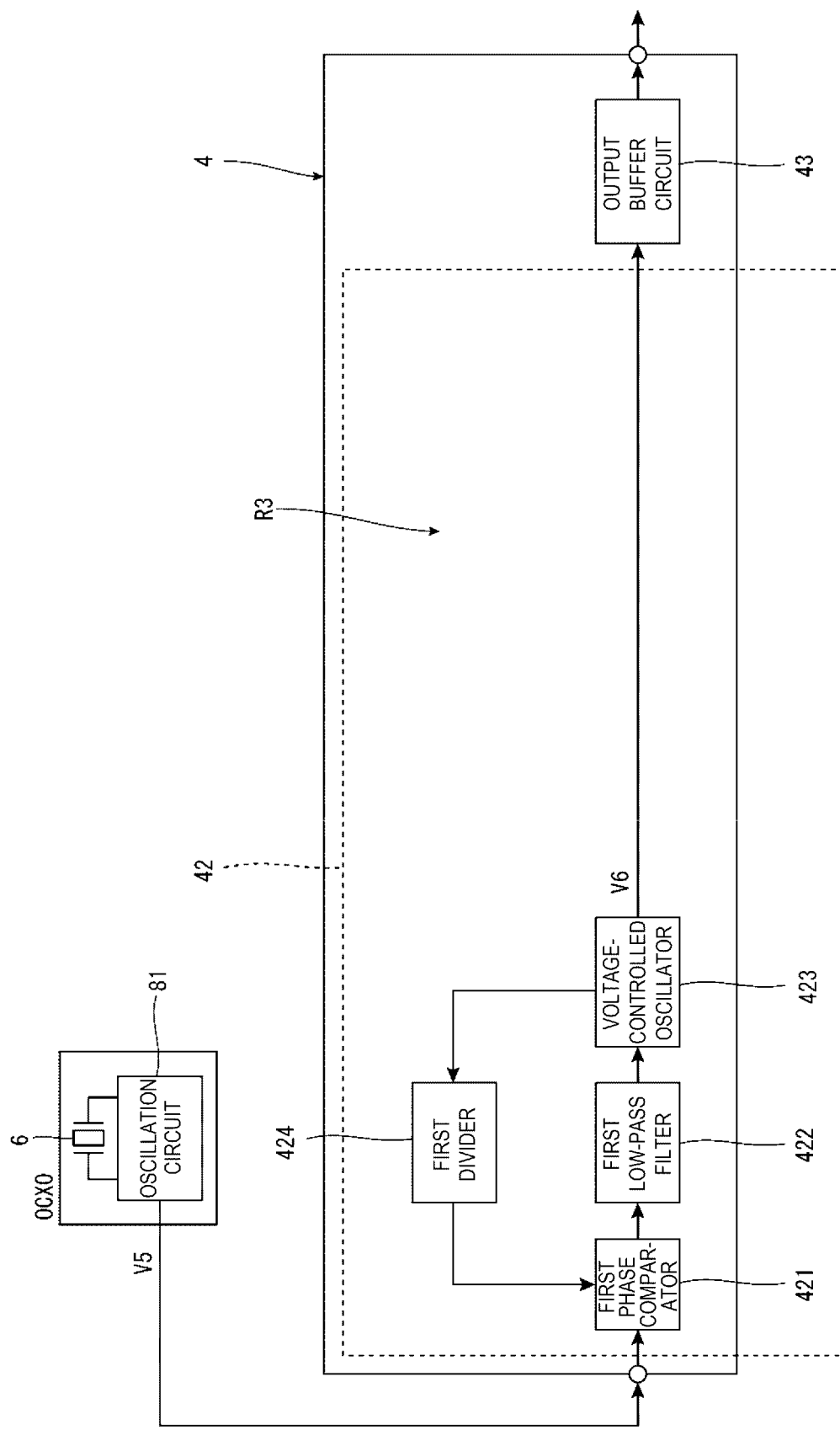
FIG. 8 is a circuit diagram illustrating a third route of the PLL circuit.
Figure 9:
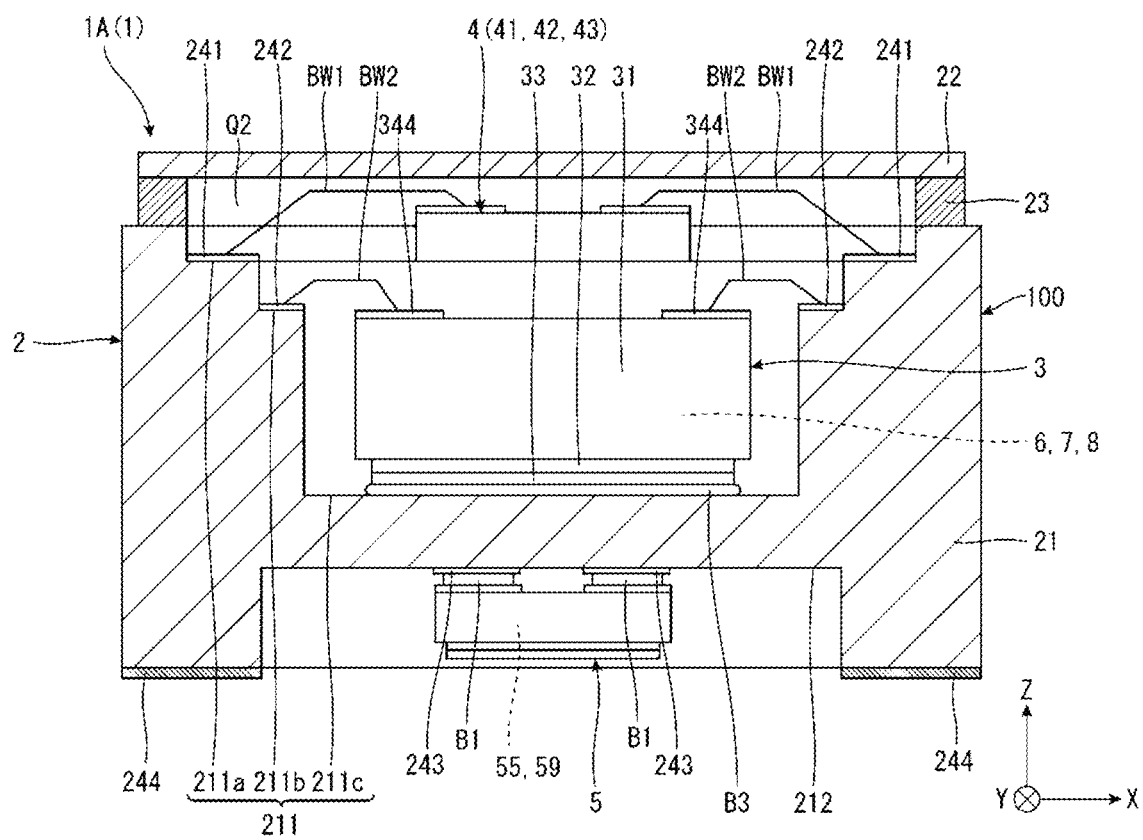
FIG. 9 is a cross-sectional view illustrating a first oscillator.
Figure 10:
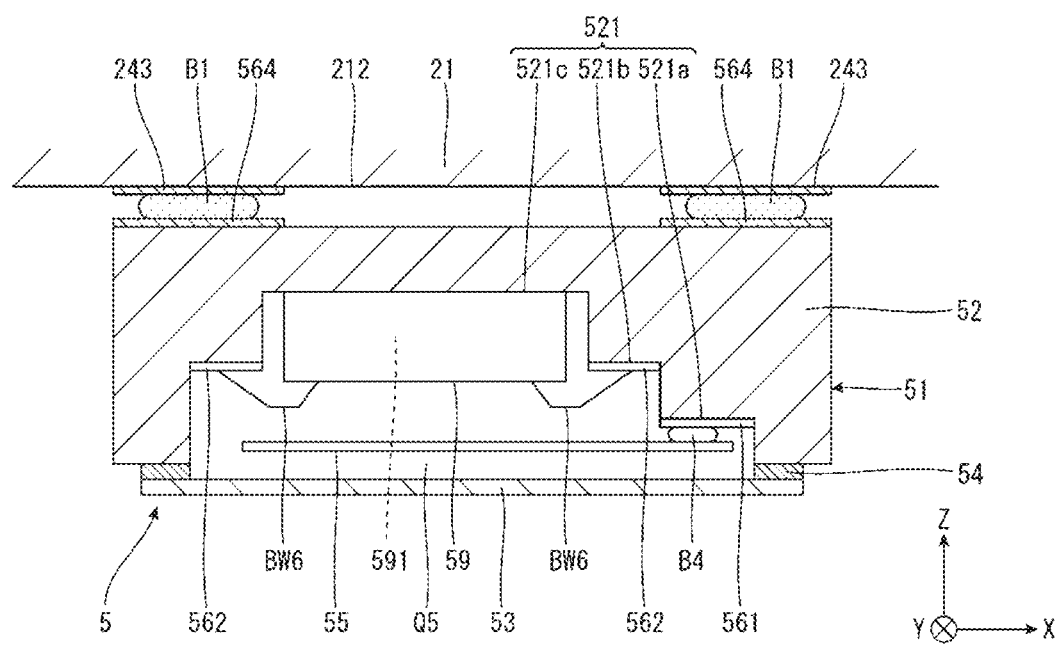
FIG. 10 is a cross-sectional view illustrating a voltage-controlled crystal oscillator provided in the first oscillator.
Figure 11:
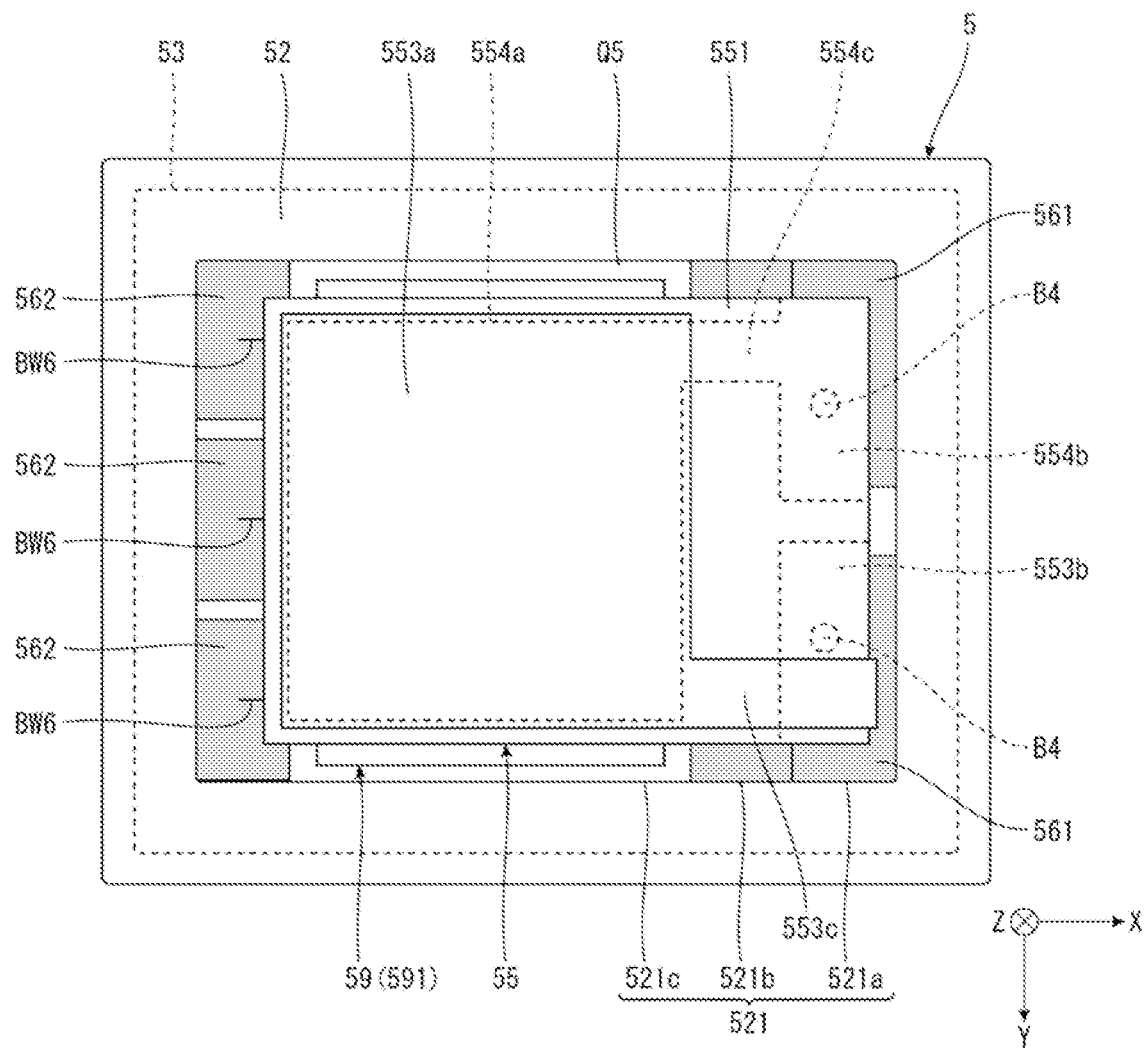
FIG. 11 is a plan view of the voltage-controlled crystal oscillator as viewed from below.
Figure 12:
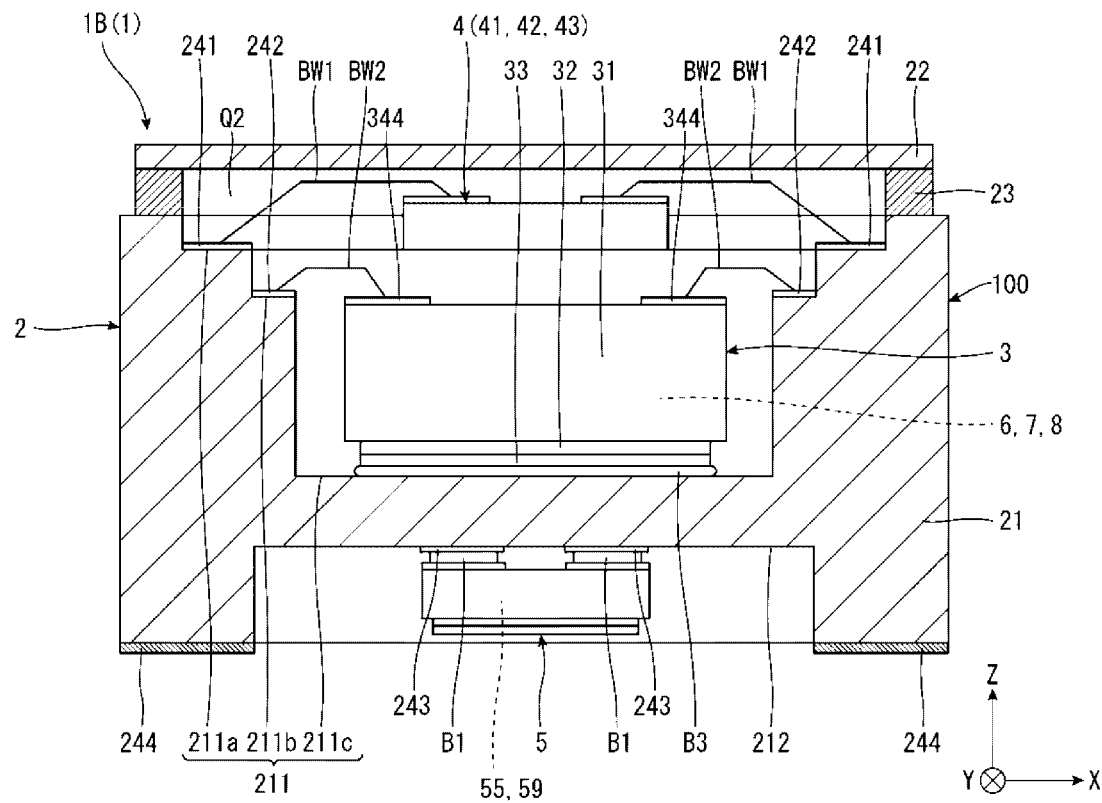
FIG. 12 is a cross-sectional view illustrating a second oscillator.
Figure 13:
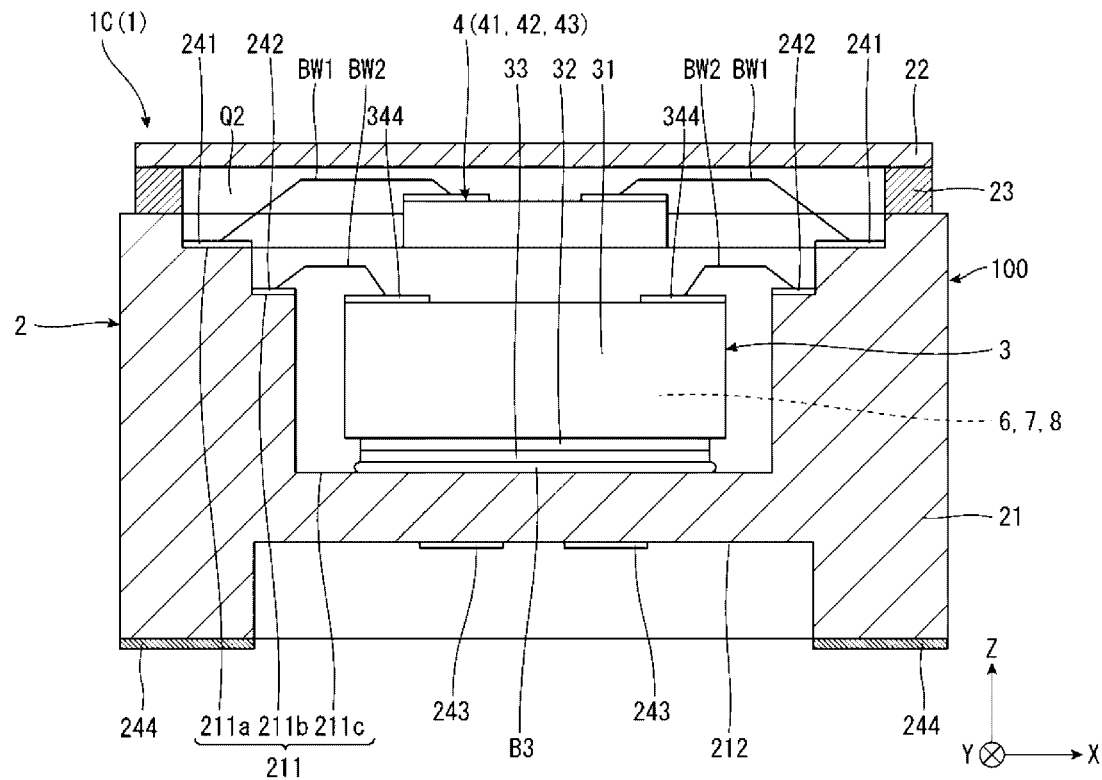
FIG. 13 is a cross-sectional view illustrating a third oscillator.
Figure 14:
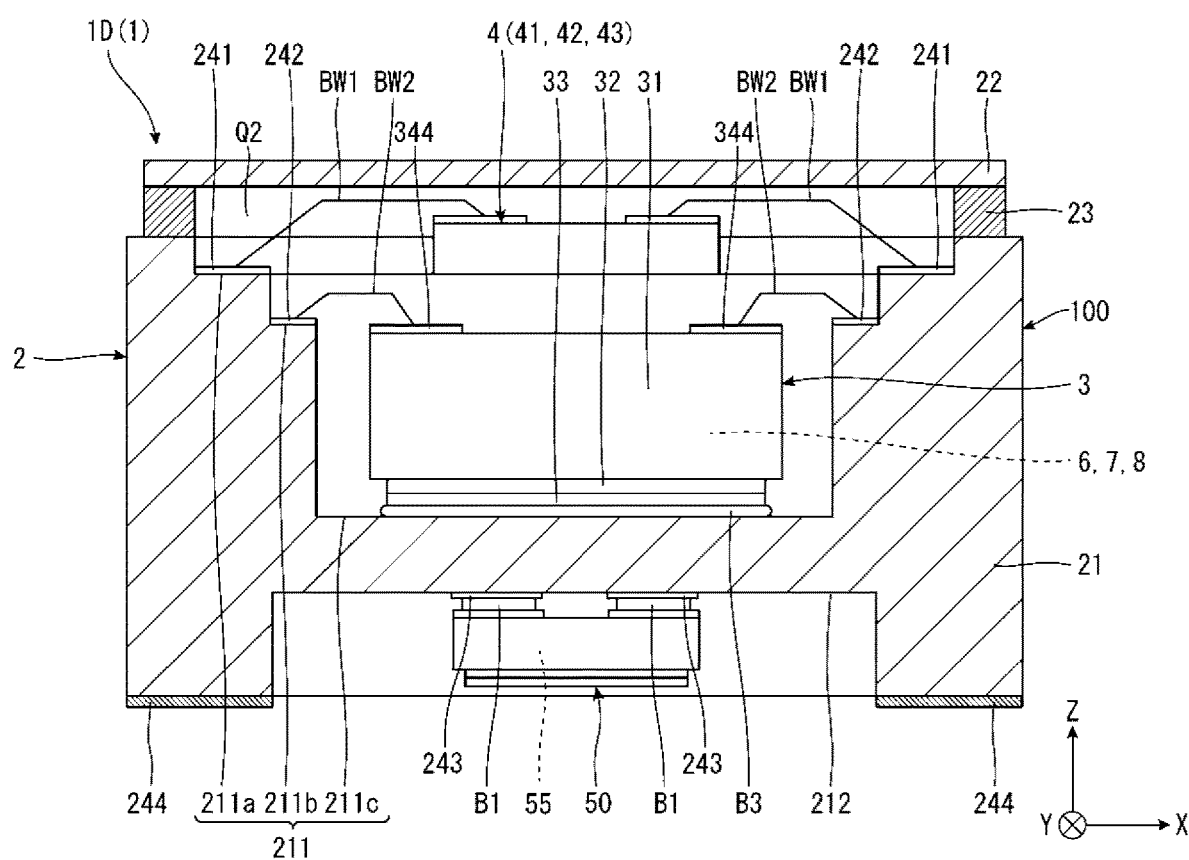
FIG. 14 is a cross-sectional view illustrating a fourth oscillator.
Figure 15:
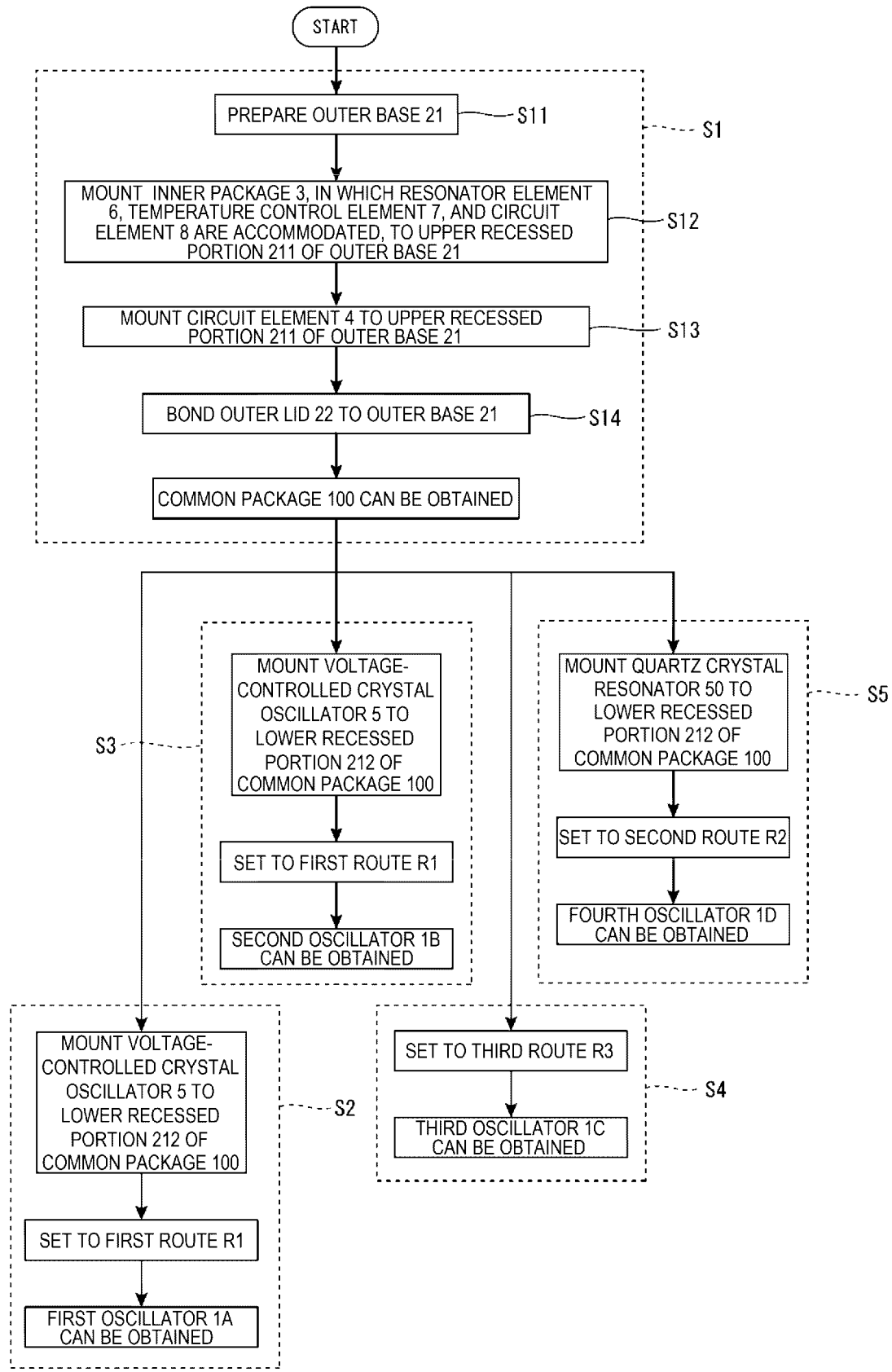
FIG. 15 is a flowchart illustrating a method for manufacturing oscillators.
Figure 16:
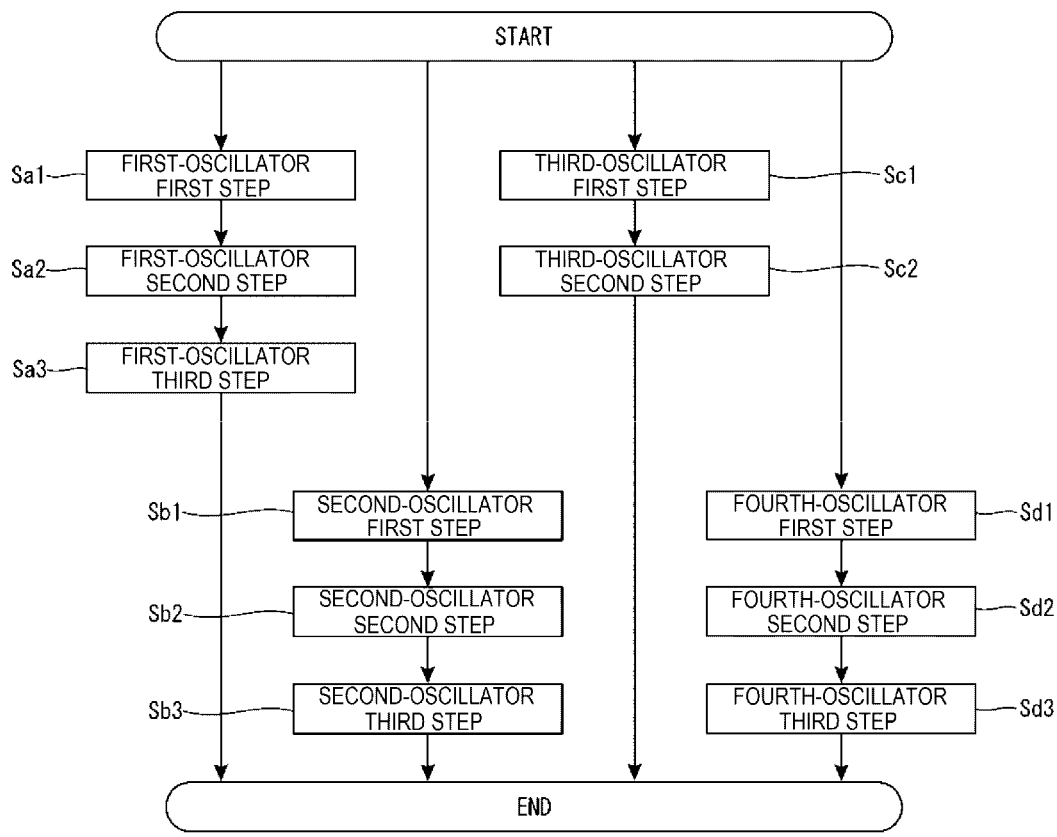
FIG. 16 is a flowchart illustrating a method for manufacturing oscillators.

FIG. 1 is a cross-sectional view illustrating a common package according to a first embodiment. FIG. 2 is a plan view of the common package as viewed from above. FIG. 3 is a cross-sectional view illustrating an inner package of the common package and an inner portion thereof. FIG. 4 is a plan view of the inner package as viewed from below. FIG. 5 is a circuit diagram illustrating a PLL circuit provided in a circuit element of the common package. FIG. 6 is a circuit diagram illustrating a first route of the PLL circuit. FIG. 7 is a circuit diagram illustrating a second route of the PLL circuit. FIG. 8 is a circuit diagram illustrating a third route of the PLL circuit. FIG. 9 is a cross-sectional view illustrating a first oscillator. FIG. 10 is a cross-sectional view illustrating a voltage-controlled crystal oscillator provided in the first oscillator. FIG. 11 is a plan view of the voltage-controlled crystal oscillator as viewed from below. FIG. 12 is a cross-sectional view illustrating a second oscillator. FIG. 13 is a cross-sectional view illustrating a third oscillator. FIG. 14 is a cross-sectional view illustrating a fourth oscillator. FIGS. 15 and 16 are flowcharts each illustrating a method for manufacturing an oscillator.

In a method for manufacturing an oscillator 1 according to the embodiment, a plurality of types of oscillators 1 are manufactured using a common package 100. Hereinafter, as an example, a case where four types of oscillators 1 in total, that is, a first oscillator LA, a second oscillator 1B, a third oscillator 1C, and a fourth oscillator 1D that are oven-controlled crystal oscillators (OCXO) are manufactured will be described. Thus, by using the common package 100, a plurality of types of oscillators 1 can be manufactured at low cost and with high efficiency. Therefore, first, the common package 100 will be described.

The common package 100 illustrated in FIGS. 1 to 4 is suitably used for an oven controlled crystal oscillator (OCXO), and includes a resonator element 6, a circuit element 8, a temperature control element 7, an inner package 3, a circuit element 4, and an outer package 2. The inner package 3 accommodates the resonator element 6, the circuit element 8, and the temperature control element 7, and the outer package 2 accommodates the inner package 3 and the circuit element 4.

The resonator element 6 corresponds to a first resonator element of the first oscillator LA, a third resonator element of the second oscillator 1B, and a fifth resonator element of the third oscillator 1C. Accordingly, this means that resonator elements 6 of the same type are used as the first resonator element, the third resonator element, and the fifth resonator element. The resonator elements 6 of the same type mean that the resonator elements 6 have the same resonance frequency, outer shape, shape of each portion represented by an electrode shape, dimension of each portion, and material (component material) of each portion. In addition, the resonator elements 6 of the same type may mean resonator elements having the same model number or identification code.

The circuit element 8 corresponds to a first circuit element of the first oscillator LA, a second circuit element of the second oscillator 1B, and a fifth circuit element of the third oscillator 1C. Accordingly, this means that circuit elements 8 of the same type are used as the first circuit element, the second circuit element, and the fifth circuit element. The circuit elements 8 of the same type mean that the circuit elements 8 have the same shape, dimension, circuit configuration, circuit layout, and the like. In addition, the circuit elements 8 of the same type may mean circuit elements having the same model number or identification code.

The temperature control element 7 corresponds to a first heater circuit of the first oscillator LA and a second heater circuit of the second oscillator 1B. Accordingly, this means that temperature control elements 7 of the same type are used as the first heater circuit and the second heater circuit. The temperature control elements 7 of the same type mean that the temperature control elements 7 have the same shape, dimension, circuit configuration, circuit layout, and the like. In addition, the temperature control elements 7 of the same type may mean temperature control elements having the same model number or identification code.

Outer Package 2

As illustrated in FIG. 1, the outer package 2 includes an outer base 21 and an outer lid 22. The outer base 21 has a box shape, and includes an upper recessed portion 211 opening in an upper surface thereof and a lower recessed portion 212 opening in a lower surface thereof. The outer lid 22 has a plate shape, and is bonded to the upper surface of the outer base 21 via a sealing member 23 such as a seal ring or low-melting glass so as to close an opening of the upper recessed portion 211. Accordingly, the upper recessed portion 211 is hermetically sealed, and an accommodating space Q2 is formed in the outer package 2. On the other hand, an opening of the lower recessed portion 212 is not sealed and faces an outside of the outer package 2.

Component materials of the outer base 21 and the outer lid 22 are not particularly limited. For example, the outer base 21 may be made of various ceramic materials containing alumina, titania or the like, and the outer lid 22 may be made of various metal materials such as Kovar.

The accommodating space Q2 will be described in detail, the upper recessed portion 211 includes a first upper recessed portion 211a that is open in the upper surface, a second upper recessed portion 211b that is open in a bottom surface of the first upper recessed portion 211a and has an opening smaller than that of the first upper recessed portion 211a, and a third upper recessed portion 211c that is open in a bottom surface of the second upper recessed portion 211b and has an opening smaller than that of the second upper recessed portion 211b. The circuit element 4 is disposed at the bottom surface of the first upper recessed portion 211a, and the inner package 3 is disposed at a bottom surface of the third upper recessed portion 211c.

The accommodating space Q2 is airtight and is in a depressurized state, preferably in a state close to vacuum. Accordingly, thermal insulation of the outer package 2 is enhanced. In addition, heat of the temperature control element 7 is less likely to escape, and heating efficiency of the resonator element 6 is improved. Therefore, it is possible to stabilize a temperature of the resonator element 6 and save power. However, an atmosphere of the accommodating space Q2 is not particularly limited.

The outer base 21 includes a plurality of internal terminals 241 disposed at the bottom surface of the first upper recessed portion 211a, a plurality of internal terminals 242 disposed at the bottom surface of the second upper recessed portion 211b, a plurality of internal terminals 243 disposed at a bottom surface of the lower recessed portion 212, and a plurality of external terminals 244 disposed at the lower surface of the outer base 21. These terminals are electrically coupled via an internal wiring (not illustrated) formed in the outer base 21 so as to implement a desired circuit. The internal terminals 241 are electrically coupled to the circuit element 4 via bonding wires BW1, and the internal terminals 242 are electrically coupled to the inner package 3 via bonding wires BW2.

The outer package 2 is described above. The outer base 21 corresponds to a first container of the first oscillator 1A, a second container of the second oscillator 1B, a fifth container of the third oscillator 1C, and a seventh container of the fourth oscillator 1D. That is, it means that outer bases 21 of the same type are used as the first container, the second container, the fifth container, and the seventh container. The outer bases 21 of the same type mean that the outer bases 21 have the same outer shape, the same shape and dimension of each portion such as the recessed portion, the electrode, and the wiring, and the same material (component material) of each portion. Further, the outer bases 21 of the same type may mean outer packages having the same model number (identification code).

The upper recessed portion 211 corresponds to a first recessed portion of the first oscillator 1A, a third recessed portion of the second oscillator 1B, a fifth recessed portion of the third oscillator 1C, and a seventh recessed portion of the fourth oscillator 1D. The lower recessed portion 212 corresponds to a second recessed portion of the first oscillator LA, a fourth recessed portion of the second oscillator 1B, a sixth recessed portion of the third oscillator 1C, and an eighth recessed portion of the fourth oscillator 1D.

Inner Package 3

As illustrated in FIG. 3, the inner package 3 includes an inner base 31 and an inner lid 32. The inner base 31 has a box shape, and includes a recessed portion 311 that is open in a lower surface thereof. The inner lid 32 has a plate shape, and is bonded to the lower surface of the inner base 31 via a sealing member 33 such as a seal ring or low-melting glass so as to close an opening of the recessed portion 311. Accordingly, the recessed portion 311 is hermetically sealed, and an accommodating space Q3 is formed in the inner package 3. The resonator element 6, the temperature control element 7, and the circuit element 8 are accommodated in the accommodating space Q3.

Component materials of the inner base 31 and the inner lid 32 are not particularly limited. For example, the inner base 31 may be made of various ceramic materials containing alumina, titania or the like, and the inner lid 32 may be made of various metal materials such as Kovar.

The accommodating space Q3 will be described in detail, the recessed portion 311 includes a first recessed portion 311a that is open in the lower surface, a second recessed portion 311b that is open in a bottom surface of the first recessed portion 311a and has an opening smaller than that of the first recessed portion 311a, and a third recessed portion 311c that is open in a bottom surface of the second recessed portion 311b and has an opening smaller than that of the second recessed portion 311b. The resonator element 6 is disposed at the bottom surface of the first recessed portion 311a, and the temperature control element 7 and the circuit element 8 are disposed side by side at a bottom surface of the third recessed portion 311c.

The accommodating space Q3 is airtight and is in a depressurized state, preferably, in a state close to vacuum. Accordingly, viscous resistance of the accommodating space Q3 is reduced, and vibration characteristics of the resonator element 6 are improved. However, an atmosphere of the accommodating space Q3 is not particularly limited.

The inner base 31 includes a plurality of internal terminals 341 disposed at the bottom surface of the first recessed portion 311a, a plurality of internal terminals 342 and 343 disposed at the bottom surface of the second recessed portion 311b, and a plurality of external terminals 344 disposed at an upper surface of the inner base 31. These terminals are electrically coupled via an internal wiring (not illustrated) formed in the inner base 31 so as to implement a desired circuit.

The internal terminals 341 are electrically coupled to the resonator element 6 via a conductive bonding member B2 and a bonding wire BW3. The internal terminals 342 are electrically coupled to the temperature control element 7 via a bonding wire BW4. The internal terminals 343 are electrically coupled to the circuit element 8 via bonding wires BW5. The external terminals 344 are electrically coupled to the outer package 2 via the bonding wires BW2.

The inner package 3 as described above is fixed to the bottom surface of the third upper recessed portion 211c via a bonding member B3 at the inner lid 32.

Resonator Element 6

The resonator element 6 is an SC-cut quartz crystal resonator element. Since the SC-cut quartz crystal resonator element has a third-order frequency-temperature characteristic, the resonator element 6 has excellent frequency stability. In particular, since the SC-cut quartz crystal resonator element has an inflection point around 95° C., the SC-cut quartz crystal resonator element is suitable for an oven-controlled crystal oscillator (OCXO) that is used to heat the resonator element 6. Therefore, the oscillator 1 with high accuracy can be manufactured at low cost using the common package 100. The SC cut refers to a cut angle in cutting from a plane obtained by rotating a plane orthogonal to a Y-axis (mechanical axis), which is a crystal axis of quartz crystal, by about 33° to 35° around an X-axis (electric axis) and further rotating the rotated plane by about 22° to 24° around a Z-axis (optical axis).

As illustrated in FIG. 4, the resonator element 6 includes a quartz-crystal substrate 61 cut out by SC cut and having a rectangular shape in a plan view, an excitation electrode 621 disposed at a central portion of an upper surface, a pad electrode 622 extracted from the excitation electrode 621 and disposed at an edge portion of the upper surface, an excitation electrode 631 disposed to face the excitation electrode 621 at a central portion of a lower surface, and a pad electrode 632 extracted from the excitation electrode 631 and disposed at an edge portion of the lower surface.

Although the resonator element 6 is described above, a configuration thereof is not particularly limited. For example, a planar shape of the quartz crystal substrate 61 is not limited to a rectangular shape, and may be a circular shape, an elliptical shape, a semicircular shape, or another polygonal shape. In addition, bevel processing of grinding an outer edge portion of the quartz-crystal substrate 61 or convex processing of forming the upper surface and the lower surface of the quartz-crystal substrate 61 into convex curved surfaces may be performed.

The resonator element 6 may be an AT-cut quartz crystal resonator element. Since the AT-cut quartz crystal resonator element has a third-order frequency-temperature characteristic, the resonator element 6 has excellent frequency stability as in the case of the SC-cut quartz crystal resonator element. In particular, since the AT-cut quartz crystal resonator element has a higher demand and a larger circulation volume than the SC-cut quartz crystal resonator element, cost reduction can be achieved.

Instead of the SC-cut quartz crystal resonator element and the AT-cut quartz crystal resonator element, a BT-cut quartz crystal resonator element, a tuning-fork type quartz crystal resonator element, a surface acoustic wave resonator, another piezoelectric resonator element, a MEMS resonance element, or the like may be used as the resonator element 6.

An end portion of the resonator element 6 is fixed at the bottom surface of the first recessed portion 311a via the bonding member B2. The pad electrodes 622 and 632 are electrically coupled to the internal terminals 341 via the bonding member B2 and the bonding wire BW3. However, a fixing method and an electrical coupling method of the resonator element 6 are not particularly limited.

Temperature Control Element 7

As illustrated in FIG. 3, the temperature control element 7 includes a temperature sensor 71 and a heating circuit 72. The temperature sensor 71 functions as a temperature detection unit configured to detect an ambient temperature, particularly a temperature of the resonator element 6, and the heating circuit 72 functions as a heating unit configured to heat the resonator element 6. The temperature control element 7 is disposed at the bottom surface of the third recessed portion 311c, and is electrically coupled to the plurality of internal terminals 342 via the bonding wires BW4. In the embodiment, since the resonator element 6 and the temperature control element 7 are accommodated in the same space, a difference between a detection result of the temperature sensor 71 and an actual temperature of the resonator element 6 is reduced.

As described above, by providing the temperature control element 7, the common package 100 capable of outputting a high-accuracy oscillation signal with little frequency fluctuation with respect to a change in environmental temperature is obtained. By using such a common package 100, it is possible to efficiently manufacture the oscillators LA, 1B, 1C, and 1D at low cost.

Circuit Element 8

As illustrated in FIG. 3, the circuit element 8 includes an oscillation circuit 81 configured to oscillate the resonator element 6. The oscillation circuit 81 is a circuit for amplifying a signal output from the resonator element 6 and feeding back the amplified signal to the resonator element 6, thereby causing the resonator element 6 to oscillate to generate an oscillation signal. The circuit element 8 further includes a temperature compensation circuit 82. The temperature compensation circuit 82 performs temperature compensation based on temperature information output from the temperature sensor 71 and temperature compensation data such that the frequency fluctuation of the oscillation signal is smaller than the frequency-temperature characteristic of the resonator element 6, preferably such that the oscillation signal is constant within a predetermined temperature range. In the circuit element 8, whether to use the temperature compensation circuit 82 can be set according to a user's desire.

In the embodiment, a mode in which the temperature compensation is performed using the temperature sensor 71 of the temperature control element 7 is described. Alternatively, a temperature sensor may be built in the circuit element 8, and the temperature compensation may be performed using the temperature sensor. Specifically, the temperature compensation may be performed based on temperature information output from the temperature sensor built in the circuit element 8 and the temperature compensation data such that the frequency fluctuation of the oscillation signal is smaller than the frequency-temperature characteristic of the resonator element 6, preferably such that the oscillation signal is constant within a predetermined temperature range.

Circuit Element 4

As illustrated in FIG. 1, the circuit element 4 includes a temperature control circuit 41 configured to control driving of the temperature control element 7, a part of a PLL circuit 42, and an output buffer circuit 43.

The temperature control circuit 41 is a circuit for controlling an amount of current flowing through a resistor of the heating circuit 72 based on an output signal of the temperature sensor 71 to keep the resonator element 6 at a constant temperature. For example, when a current temperature determined based on the output signal of the temperature sensor 71 is lower than a set reference temperature, the temperature control circuit 41 performs control such that a desired current flows through the resistor of the heating circuit 72. When the current temperature is higher than the reference temperature, the temperature control circuit 41 performs control such that the current does not flow through the resistor of the heating circuit 72. In addition, for example, the temperature control circuit 41 performs control to increase or decrease the amount of current flowing through the resistor of the heating circuit 72 according to a difference between the current temperature and the reference temperature.

As illustrated in FIG. 5, the circuit element 4 includes, as a part of the PLL circuit 42, a first phase comparator 421, a first low-pass filter 422, a voltage-controlled oscillator 423, a first divider 424, a second phase comparator 425, a second low-pass filter 426, an oscillation circuit 427, and a second divider 428. In order to enhance versatility, the circuit element 4 further includes a first switch circuit SW1 disposed between the voltage-controlled oscillator 423 and the second phase comparator 425 and a second switch circuit SW2 disposed between the second low-pass filter 426 and the oscillation circuit 427.

In such a circuit element 4, a first route R1 illustrated in FIG. 6, a second route R2 illustrated in FIG. 7, or a third route R3 illustrated in FIG. 8 can be set by switching between routes using the first and second switch circuits SW1 and SW2. Accordingly, the circuit element 4 having high versatility is obtained. The route may be set, for example, by writing, in the circuit element 4, a program corresponding to a route to be set, or by writing programs corresponding to all routes in advance and selecting a predetermined program from the written programs.

The common package 100 is described above. Next, the first oscillator LA, the second oscillator 1B, the third oscillator 1C, and the fourth oscillator 1D manufactured using the common package 100 will be described in this order.

First Oscillator 1A

The first oscillator 1A is an oven-controlled crystal oscillator (OCXO). Therefore, the temperature compensation circuit 82 provided in the circuit element 8 is not used. The circuit element 4 is set to the first route R1. As illustrated in FIG. 9, the first oscillator LA has a configuration in which a voltage-controlled crystal oscillator 5 is disposed in the common package 100. The voltage-controlled crystal oscillator 5 is disposed in the lower recessed portion 212, and is electrically coupled to the internal terminals 243 via a conductive bonding member B1.

As described above, since the lower recessed portion 212 is formed in the lower surface of the outer package 2 and the voltage-controlled crystal oscillator 5 is mounted to the lower recessed portion 212, mounting of the voltage-controlled crystal oscillator 5 is facilitated. In addition, according to such a configuration, a package in which the upper recessed portion 211 is sealed with the outer lid 22 can be set as the common package 100. Therefore, the number of components provided in the common package 100 is increased, and the number of individual steps for each of the oscillators LA, 1B, 1C, and 1D is reduced accordingly, and the oscillators LA, 1B, 1C, and 1D can be manufactured efficiently.

As illustrated in FIG. 6, the voltage-controlled crystal oscillator 5 is an oscillator provided in the PLL circuit 42. As illustrated in FIG. 10, the voltage-controlled crystal oscillator 5 includes a package 51, and a resonator element 55 and a circuit element 59 accommodated in the package 51. In this way, by accommodating the resonator element 55 and the circuit element 59 in the package 51, the resonator element 55 and the circuit element 59 can be collectively mounted to the outer base 21. The resonator element 55 and the circuit element 59 can also be protected by the package 51.

The package 51 corresponds to a third container of the first oscillator 1A and a fourth container of the second oscillator 1B. The resonator element 55 corresponds to a second resonator element of the first oscillator LA and a fourth resonator element of the second oscillator 1B. The circuit element 59 corresponds to a third circuit element of the first oscillator LA and a fourth circuit element of the second oscillator 1B.

The package 51 includes a base 52 and a lid 53. The base 52 has a box shape and includes a recessed portion 521 that is open in a lower surface thereof. The lid 53 has a plate shape, and is bonded to the lower surface of the base 52 via a sealing member 54 such as a seal ring or low-melting glass so as to close an opening of the recessed portion 521. Accordingly, the recessed portion 521 is hermetically sealed, and an accommodating space Q5 is formed in the package 51. The resonator element 55 and the circuit element 59 are accommodated in the accommodating space Q5.

Component materials of the base 52 and the lid 53 are not particularly limited. For example, the base 52 may be made of various ceramic materials containing alumina, titania or the like, and the lid 53 may be made of various metal materials such as Kovar.

The accommodating space Q5 will be described in detail, the recessed portion 521 includes a first recessed portion 521a that is open in the lower surface, a second recessed portion 521b that is open in a bottom surface of the first recessed portion 521a and has an opening smaller than that of the first recessed portion 521a, and a third recessed portion 521c that is open in a bottom surface of the second recessed portion 521b and has an opening smaller than that of the second recessed portion 521b. The resonator element 55 is disposed at the bottom surface of the first recessed portion 521a, and the circuit element 59 is disposed at a bottom surface of the third recessed portion 521c. The accommodating space Q5 is airtight and is in a depressurized state, preferably in a state close to vacuum. Accordingly, viscous resistance of the accommodating space Q5 is reduced, and vibration characteristics of the resonator element 55 are improved. However, an atmosphere of the accommodating space Q5 is not particularly limited.

The base 52 includes a plurality of internal terminals 561 disposed at the bottom surface of the first recessed portion 521a, a plurality of internal terminals 562 disposed at the bottom surface of the second recessed portion 521b, and a plurality of external terminals 564 disposed at an upper surface of the base 52. These terminals are electrically coupled via an internal wiring (not illustrated) formed in the base 52 so as to implement a desired circuit. The internal terminals 561 are electrically coupled to the resonator element 55 via a conductive bonding member B4. The internal terminals 562 are electrically coupled to the circuit element 59 via bonding wires BW6. The external terminals 564 are electrically coupled to the internal terminals 243 via the bonding member B1.

The resonator element 55 is an AT-cut quartz crystal resonator element. Since the AT-cut quartz crystal resonator element has a third-order frequency-temperature characteristic, the resonator element 55 has excellent frequency stability. Therefore, the first oscillator LA with high accuracy is obtained. The AT cut refers to a cut angle in cutting from a plane obtained by rotating a plane orthogonal to a Y-axis (mechanical axis), which is a crystal axis of quartz crystal, by about 33° to 36° around an X-axis (electric axis).

As illustrated in FIG. 11, the resonator element 55 includes an oblong quartz-crystal substrate 551 cut out by AT-cut, excitation electrodes 553a and 554a arranged to face each other at upper and lower surfaces of the quartz-crystal substrate 551, pad electrodes 553b and 554b arranged at the upper surface of the quartz-crystal substrate 551, and extraction electrodes 553c and 554c coupling the excitation electrodes 553a and 554a and the pad electrodes 553b and 554b.

Although the resonator element 55 is described above, a configuration thereof is not particularly limited. For example, a planar shape of the quartz-crystal substrate 551 is not limited to an oblong shape, and may be a circular shape, a rectangular shape other than an oblong shape, or another polygonal shape. In addition, bevel processing of grinding an outer edge portion of the quartz-crystal substrate 551 or convex processing of forming the upper surface and the lower surface of the quartz-crystal substrate 551 into convex curved surfaces may be performed. Instead of the AT-cut quartz crystal resonator element, an SC-cut quartz crystal resonator element, a BT-cut quartz crystal resonator element, a tuning-fork type quartz crystal resonator element, a surface acoustic wave resonator element, another piezoelectric resonator element, a MEMS resonance element, or the like may be used as the resonator element 55.

An end portion of the resonator element 55 is fixed at the bottom surface of the first recessed portion 521a via the bonding member B4. The pad electrodes 553b and 554b are electrically coupled to the internal terminals 561 via the bonding member B4. However, a fixing method and an electrical coupling method of the resonator element 55 are not particularly limited.

The circuit element 59 includes an oscillation circuit 591 configured to oscillate the resonator element 55. The oscillation circuit 591 is electrically coupled to the resonator element 55, amplifies an output signal of the resonator element 55, and feeds back the amplified signal to the resonator element 55 to oscillate the resonator element 55.

The configuration of the first oscillator 1A is described above. In the first oscillator 1A, the PLL circuit 42 operates as follows. Since the first oscillator 1A includes the voltage-controlled crystal oscillator 5, the oscillation circuit 427 in the PLL circuit 42 is not necessary. Therefore, as described above, the first route R1 illustrated in FIG. 6 is set.

The first phase comparator 421 detects a phase difference between a first oscillation signal V1, which is a reference frequency signal output from the oscillation circuit 81, and a frequency signal output from the first divider 424, and outputs the detected phase difference to the first low-pass filter 422. The first low-pass filter 422 removes the high-frequency component from the output signal from the first phase comparator 421, converts the signal into a voltage, and outputs the voltage as a DC signal for controlling the voltage-controlled oscillator 423. The first divider 424 outputs a frequency signal, which is obtained by dividing a frequency signal output from the voltage-controlled oscillator 423, to the first phase comparator 421.

For example, the first divider 424 can set a decimal division ratio by switching an integer division ratio to a decimal division ratio on average. Accordingly, a PLL circuit portion at an upstream stage including the first phase comparator 421, the first low-pass filter 422, the voltage-controlled oscillator 423, and the first divider 424 functions as a decimal division PLL circuit (fractional PLL circuit). As a result, in the decimal division PLL circuit, a signal of any frequency can be output.

The second phase comparator 425 detects a phase difference between a frequency signal output from the voltage-controlled oscillator 423 and a frequency signal output from the second divider 428, and outputs the detected phase difference to the second low-pass filter 426. The second low-pass filter 426 removes the high-frequency component from an output signal from the second phase comparator 425, converts the signal into a voltage, and outputs a DC signal for controlling the voltage-controlled crystal oscillator 5. The second divider 428 outputs a frequency signal, which is obtained by dividing a frequency signal output from the voltage-controlled crystal oscillator 5, to the second phase comparator 425.

The second divider 428 is, for example, an integer divider configured to divide an input signal by an integer. Accordingly, a PLL circuit portion at a downstream stage including the second phase comparator 425, the second low-pass filter 426, the voltage-controlled crystal oscillator 5, and the second divider 428 functions as an integer division PLL circuit (integer PLL circuit). In the integer division PLL circuit, phase noise is relatively little, and a circuit configuration can be relatively simple.

The voltage-controlled crystal oscillator 5 outputs a third oscillation signal V3, which is a frequency signal corresponding to the voltage of the DC signal, to the output buffer circuit 43. That is, the PLL circuit 42 oscillates the resonator element 55 to generate the third oscillation signal V3 whose frequency is controlled based on the first oscillation signal V1. Accordingly, the first oscillator 1A with high accuracy is obtained.

Second Oscillator 1B

The second oscillator 1B illustrated in FIG. 12 has the same configuration as the first oscillator 1A described above except that the configuration of the voltage-controlled crystal oscillator 5 is different. In the second oscillator 1B, a frequency (oscillation frequency) of the resonator element 55 is different from that in the first oscillator 1A. For example, while the oscillation frequency of the resonator element 55 is 20 MHz in the first oscillator LA, the oscillation frequency of the resonator element 55 is 40 MHz in the second oscillator 1B.

The configuration of the second oscillator 1B is described above. In the second oscillator 1B, the PLL circuit 42 operates as follows.

As illustrated in FIG. 6, the first phase comparator 421 detects a phase difference between a second oscillation signal V2, which is a reference frequency signal output from the oscillation circuit 81, and a frequency signal output from the first divider 424, and outputs the detected phase difference to the first low-pass filter 422. The first low-pass filter 422 removes the high-frequency component from an output signal from the first phase comparator 421, converts the signal into a voltage, and outputs the voltage as a DC signal for controlling the voltage-controlled oscillator 423. The first divider 424 outputs a frequency signal, which is obtained by dividing a frequency signal output from the voltage-controlled oscillator 423, to the first phase comparator 421.

The second phase comparator 425 detects a phase difference between a frequency signal output from the voltage-controlled oscillator 423 and a frequency signal output from the second divider 428, and outputs the detected phase difference to the second low-pass filter 426. The second low-pass filter 426 removes the high-frequency component from the output signal from the second phase comparator 425, converts the signal into a voltage, and outputs a DC signal for controlling the voltage-controlled crystal oscillator 5. The second divider 428 outputs a frequency signal, which is obtained by dividing a frequency signal output from the voltage-controlled crystal oscillator 5, to the second phase comparator 425.

The voltage-controlled crystal oscillator 5 outputs a fourth oscillation signal V4, which is a frequency signal corresponding to the voltage of the DC signal, to the output buffer circuit 43. That is, the PLL circuit 42 oscillates the resonator element 55 to generate the fourth oscillation signal V4 whose frequency is controlled based on the second oscillation signal V2. Accordingly, the second oscillator 1B with high accuracy is obtained.

Third Oscillator 1C

The third oscillator 1C illustrated in FIG. 13 is the same as the above-described first oscillator 1A except that the voltage-controlled crystal oscillator 5 is omitted and the PLL circuit 42 is set to the third route R3. That is, the third oscillator 1C includes only the common package 100. Accordingly, the third oscillator 1C can be manufactured at low cost. In the third oscillator 1C, the PLL circuit 42 operates as follows.

As illustrated in FIG. 8, the first phase comparator 421 detects a phase difference between a fifth oscillation signal V5, which is a reference frequency signal output from the oscillation circuit 81, and a frequency signal output from the first divider 424, and outputs the detected phase difference to the first low-pass filter 422. The first low-pass filter 422 removes a high-frequency component from the output signal from the first phase comparator 421, converts the signal into a voltage, and outputs the voltage as a DC signal for controlling the voltage-controlled oscillator 423. The first divider 424 outputs a frequency signal, which is obtained by dividing a frequency signal output from the voltage-controlled oscillator 423, to the first phase comparator 421. The voltage-controlled oscillator 423 outputs a sixth oscillation signal V6, which is a frequency signal corresponding to the voltage of the DC signal, to the output buffer circuit 43.

Fourth Oscillator 1D

The fourth oscillator 1D illustrated in FIG. 14 is the same as the above-described first oscillator 1A except that a quartz crystal resonator 50 is used instead of the voltage-controlled crystal oscillator 5 and the circuit element 4 is set to the second route R2. The quartz crystal resonator 50 has a configuration obtained by omitting the circuit element 59 from the voltage-controlled crystal oscillator 5. Instead, as illustrated in FIG. 7, the oscillation circuit 427 of the circuit element 4 is electrically coupled to the resonator element 55. In the fourth oscillator 1D, the PLL circuit 42 operates as follows.

As illustrated in FIG. 7, the first phase comparator 421 detects a phase difference between a seventh oscillation signal V7, which is a reference frequency signal output from the oscillation circuit 81, and a frequency signal output from the first divider 424, and outputs the detected phase difference to the first low-pass filter 422. The first low-pass filter 422 removes a high-frequency component from the output signal from the first phase comparator 421, converts the signal into a voltage, and outputs the voltage as a DC signal for controlling the voltage-controlled oscillator 423. The first divider 424 outputs a frequency signal, which is obtained by dividing a frequency signal output from the voltage-controlled oscillator 423, to the first phase comparator 421.

The second phase comparator 425 detects a phase difference between a frequency signal output from the voltage-controlled oscillator 423 and a frequency signal output from the second divider 428, and outputs the detected phase difference to the second low-pass filter 426. The second low-pass filter 426 removes a high-frequency component from the output signal from the second phase comparator 425, converts the signal into a voltage, and outputs a DC signal for controlling the oscillation circuit 427. The second divider 428 outputs a frequency signal, which is obtained by dividing a frequency signal output from the oscillation circuit 427, to the second phase comparator 425.

The oscillation circuit 427 outputs an eighth oscillation signal V8, which is a frequency signal corresponding to the voltage of the DC signal, to the output buffer circuit 43. That is, the PLL circuit 42 oscillates the resonator element 55 to generate the eighth oscillation signal V8 whose frequency is controlled based on the seventh oscillation signal V7. Accordingly, the fourth oscillator 1D with high accuracy is obtained.

The oscillators LA, 1B, 1C, and 1D are described above. Next, a method for manufacturing the plurality of oscillators 1 (1A, 1B, 1C, and 1D) will be described. As illustrated in FIG. 15, a method for manufacturing a plurality of oscillators 1 includes: a step S1 of preparing a plurality of common packages 100; a step S2 of manufacturing the first oscillator 1A by mounting the voltage-controlled crystal oscillator 5 having a predetermined oscillation frequency to the lower recessed portion 212 of the common package 100 and setting the PLL circuit 42 to the first route R1; a step S3 of manufacturing the second oscillator 1B by mounting the voltage-controlled crystal oscillator 5, which has an oscillation frequency different from that of the above voltage-controlled crystal oscillator 5 mounted to the first oscillator LA, to the lower recessed portion 212 of the common package 100 and setting the PLL circuit 42 to the first route R1; a step S4 of manufacturing the third oscillator 1C by setting the PLL circuit 42 to the third route R3; and a step S5 of manufacturing the fourth oscillator 1D by mounting the quartz crystal resonator 50 to the lower recessed portion 212 of the common package 100 and setting the PLL circuit 42 to the second route R2.

In manufacturing of the four types of oscillators LA, 1B, 1C, and 1D, after the step S1 is performed, the step S2 is performed when a manufacturing target is the first oscillator 1A, the step S3 is performed when the manufacturing target is the second oscillator 1B, the step S4 is performed when the manufacturing target is the third oscillator 1C, and the step S5 is performed when the manufacturing target is the fourth oscillator 1D.

The step S1 includes: a step S11 of preparing the outer base 21; a step S12 of mounting the inner package 3, in which the resonator element 6, the temperature control element 7, and the circuit element 8 are accommodated, to the upper recessed portion 211 of the outer base 21; a step S13 of mounting the circuit element 4 to the upper recessed portion 211 of the outer base 21; and a step S14 of bonding the outer lid 22 to the outer base 21 to obtain the common package 100.

Here, the manufacturing method, in other words, the method for manufacturing the oscillators 1, as illustrated in FIG. 16, includes manufacturing the first oscillator LA, the manufacturing the first oscillator LA including a first-oscillator first step Sa1 of mounting the resonator element 6, the temperature control element 7, and the circuit element 8 to the upper recessed portion 211 of the outer base 21, a first-oscillator second step Sa2 of mounting the voltage-controlled crystal oscillator 5 to the lower recessed portion 212 of the outer base 21, and a first-oscillator third step Sa3 of setting the PLL circuit 42; manufacturing the second oscillator 1B, the manufacturing the second oscillator 1B including a second-oscillator first step Sb1 of mounting the resonator element 6, the temperature control element 7, and the circuit element 8 to the upper recessed portion 211 of the outer base 21, a second-oscillator second step Sb2 of mounting the voltage-controlled crystal oscillator 5 to the lower recessed portion 212 of the outer base 21, and a second-oscillator third step Sb3 of setting the PLL circuit 42; manufacturing the third oscillator 1C, the manufacturing the third oscillator 1C including a third-oscillator first step Sc1 of mounting the resonator element 6, the temperature control element 7, and the circuit element 8 to the upper recessed portion 211 of the outer base 21, and a third-oscillator second step Sc2 of setting the PLL circuit 42; and manufacturing the fourth oscillator 1D, the manufacturing the fourth oscillator 1D including a fourth-oscillator first step Sd1 of mounting the resonator element 6, the temperature control element 7, and the circuit element 8 to the upper recessed portion 211 of the outer base 21, a fourth-oscillator second step Sd2 of mounting the quartz crystal resonator 50 to the lower recessed portion 212 of the outer base 21, and a fourth-oscillator third step Sd3 of setting the PLL circuit 42.

According to the method for manufacturing the oscillators 1, since the common package 100 is used, it is possible to efficiently manufacture a plurality of oscillators 1 (1A, 1B, 1C, and 1D) of different types at low cost.

Although the four types of oscillators LA, 1B, 1C, and 1D are manufactured using the common package 100 in the embodiment, the present disclosure is not limited thereto, and at least two oscillators having different output frequencies may be manufactured using the common package 100. In the example of the embodiment, the first oscillator 1A and the second oscillator 1B may be manufactured. In this case, since only the first route R1 is used in the PLL circuit 42, the oscillation circuit 427, the first switch circuit SW1, and the second switch circuit SW2 can be omitted from the PLL circuit 42. Further, the third oscillator 1C and a fifth oscillator, in which the frequency of the resonator element 55 is different from that in the third oscillator 1C, may be manufactured. In this case, since only the second route R2 is used in the PLL circuit 42, the first switch circuit SW1 and the second switch circuit SW2 can be omitted from the PLL circuit 42.

Although the oscillator 1 that is an oven-controlled crystal oscillator (OCXO) is manufactured using the common package 100 in the embodiment, the oscillator 1 is not limited to the oven-controlled crystal oscillator (OCXO). For example, the oscillator 1 that is a simple packaged crystal oscillator (SPXO) may be manufactured by setting the temperature control element 7 and the temperature compensation circuit 82 not to be used together, or the oscillator 1 that is a temperature-compensated crystal oscillator (TCXO) may be manufactured by setting the temperature control element 7 not to be used and the temperature compensation circuit 82 to be used. When manufacturing only the oscillator 1 that is an oven-controlled crystal oscillator, the temperature compensation circuit 82 may be omitted from the circuit element 8.

In the embodiment, the resonator element 55 and the circuit element 59 are mounted to the outer base 21 in a state of being accommodated in the package 51 in the embodiment. Alternatively, the package 51 may be omitted, and the resonator element 55 and the circuit element 59 may be mounted to the outer base 21 separately. In this case, the opening of the lower recessed portion 212 is preferably covered with a lid to form an accommodating space. According to such a configuration, a reduction in size of common package 100 can be achieved.

The method for manufacturing the oscillators 1 is described above. As described above, the method for manufacturing the oscillators 1 is a method for manufacturing the oscillators 1 of a plurality of types including the first oscillator 1A and the second oscillator 1B, the method including: manufacturing the first oscillator 1A, the manufacturing the first oscillator LA including the first-oscillator first step Sa1 of mounting the resonator element 6 and the circuit element 8 to the outer base 21 serving as a first container, the resonator element 6 being a first resonator element and the circuit element 8 being a first circuit element configured to oscillate the oscillator element 6 to generate the first oscillation signal V1, and the first-oscillator second step Sa2 of mounting, to the outer base 21, the resonator element 55 that is a second resonator element whose oscillation frequency is controlled based on the first oscillation signal V1; and manufacturing the second oscillator 1B, the manufacturing the second oscillator 1B including the second-oscillator first step Sb1 of mounting the resonator element 6 and the circuit element 8 to the outer base 21 that is a second container of the same type as the outer base 21 of the first oscillator 1A, the resonator element 6 being a third resonator element of the same type as the resonator element 6 of the first oscillator LA and the circuit element 8 being a second circuit element of the same type as the circuit element 8 of the first oscillator LA and being configured to oscillate the resonator element 6 to generate the second oscillation signal V2, and the second-oscillator second step Sb2 of mounting the resonator element 55 to the outer base 21, the resonator element 55 being a fourth resonator element whose oscillation frequency is controlled based on the second oscillation signal V2 and whose frequency is different from that of the resonator element 55. According to such a manufacturing method, since the first-oscillator first step Sa1 and the second-oscillator first step Sb1 are common, the first oscillator 1A and the second oscillator 1B having different output frequencies can be efficiently manufactured at low cost.

Further, as described above, the outer base 21 serving as the first container includes the upper recessed portion 211 that is a first recessed portion opening in one main surface, and the lower recessed portion 212 that is a second recessed portion opening in the other main surface. In the first-oscillator first step Sa1, the resonator element 6 and the circuit element 8 are mounted to the upper recessed portion 211, and in the first-oscillator second step Sa2, the resonator element 55 is mounted to the lower recessed portion 212. The outer base 21 serving as the second container includes the upper recessed portion 211 that is a third recessed portion opening in one main surface, and the lower recessed portion 212 that is a fourth recessed portion opening in the other main surface. In the second-oscillator first step Sb1, the resonator element 6 and the circuit element 8 are mounted to the upper recessed portion 211, and in the second-oscillator second step Sb2, the resonator element 55 is mounted to the lower recessed portion 212. According to such a method, it is possible to increase the number of steps that can be performed in common between the first-oscillator first step Sa1 and second-oscillator first step Sb1. Therefore, the number of steps in the first-oscillator second step Sa2 and the second-oscillator second step Sb2, which are individual steps, can be reduced. Accordingly, the first oscillator LA and the second oscillator 1B having different output frequencies can be efficiently manufactured at low cost.

Further, as described above, in the first-oscillator first step Sa1, the temperature control element 7 that is a first heater circuit configured to heat the resonator element 6 is further mounted to the outer base 21, and in the second-oscillator first step Sb1, the temperature control element 7 that is a second heater circuit of the same type as the temperature control element 7 configured to heat the resonator element 6 is further mounted to the outer base 21. As described above, by providing the temperature control element 7, it is possible to manufacture the first oscillator LA and the second oscillator 1B capable of outputting a high-accuracy oscillation signal with little frequency fluctuation with respect to a change in environmental temperature.

As described above, each of the resonator element 6 of the first oscillator 1A and the resonator element 6 of the second oscillator 1B is an SC-cut quartz crystal resonator element. Since the SC-cut quartz crystal resonator element has a third-order frequency-temperature characteristic, the resonator element 6 has excellent frequency stability. In particular, since the SC-cut quartz crystal resonator element has an inflection point around 95° C., the SC-cut quartz crystal resonator element is suitable for an oven-controlled crystal oscillator (OCXO) that is used to heat the resonator element 6.

As described above, each of the resonator element 6 of the first oscillator 1A and the resonator element 6 of the second oscillator 1B is an AT-cut quartz crystal resonator element. Since the AT-cut crystal resonator element has a third-order frequency-temperature characteristic, the resonator element 6 has excellent frequency stability. In particular, since the AT-cut quartz crystal resonator element has a higher demand and a larger circulation volume than the SC-cut quartz crystal resonator element, cost reduction can be achieved.

As described above, each of the resonator element 55 of the first oscillator LA and the resonator element 55 of the second oscillator 1B is an AT-cut quartz crystal resonator element. Since the AT-cut crystal resonator element has a third-order frequency-temperature characteristic, the resonator element 55 has excellent frequency stability.

Further, as described above, in the first-oscillator second step Sa2, the circuit element 59 that is a third circuit element configured to oscillate the resonator element 55 to generate the third oscillation signal V3 whose frequency is controlled based on the first oscillation signal V1 is further mounted to the outer base 21, and in the second-oscillator second step Sb2, the circuit element 59 that is a fourth circuit element configured to oscillate the resonator element 55 to generate the fourth oscillation signal V4 whose frequency is controlled based on the second oscillation signal V2 is further mounted to the outer base 21. Accordingly, the third oscillation signal V3 and the fourth oscillation signal V4 with little phase noise can be generated.

As described above, in the first-oscillator second step Sa2, the resonator element 55 and the circuit element 59 are mounted to the outer base 21 in a state of being accommodated in the package 51 serving as a third container, and in the second-oscillator second step Sb2, the resonator element 55 and the circuit element 59 are mounted to the outer base 21 in a state of being accommodated in the package 51 serving as a fourth container. As described above, since the resonator element 55 and the circuit element 59 can be collectively mounted by using the package 51, handleability is improved. Therefore, the first-oscillator second step Sa2 and the second-oscillator second step Sb2 can be smoothly performed. The resonator element 55 and the circuit element 59 can also be protected by the package 51.

As described above, the method for manufacturing the oscillator 1 includes manufacturing the third oscillator 1C, the manufacturing the third oscillator 1C including the third-oscillator first step Sc1 of mounting the resonator element 6 and the circuit element 8 to the outer base 21 that is a fifth container of the same type as the outer base 21 of the first oscillator LA, the resonator element 6 being a fifth resonator element of the same type as the resonator element 6 of the first oscillator LA, and the circuit element 8 being a fifth circuit element of the same type as the circuit element 8 of the first oscillator 1A and being configured to oscillate the resonator element 6 to generate the fifth oscillation signal V5. According to such a manufacturing method, since the first-oscillator first step Sa1, the second-oscillator first step Sb1, and the third-oscillator first step Sc1 are common, the first oscillator LA, the second oscillator 1B, and the third oscillator 1C of different types can be efficiently manufactured at low cost.

Second Embodiment

Figure 17:
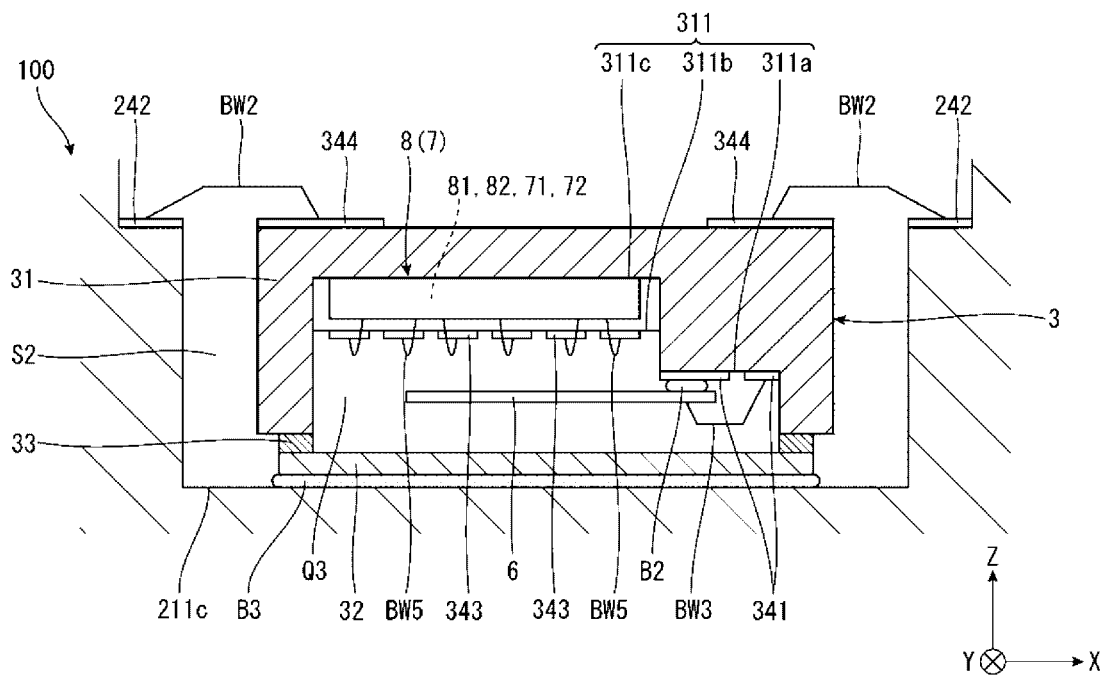
FIG. 17 is a cross-sectional view illustrating a common package according to a second embodiment.

FIG. 17 is a cross-sectional view of a common package according to a second embodiment.

The common package 100 according to the embodiment is the same as the common package 100 of the first embodiment described above except that the circuit element 8 includes the temperature control element 7. In the following description, the common package 100 of the embodiment is described with a focus on differences from the first embodiment described above, and a description of the similar matters is omitted. In the drawing of the embodiment, configurations similar to those of the above-described embodiment will be denoted by the same reference signs.

As illustrated in FIG. 17, in the common package 100 of the embodiment, the circuit element 8 includes the temperature control element 7. In other words, the circuit element 8 has a function of the temperature control element 7. Accordingly, the number of components is reduced, and manufacturing of the common package 100 is facilitated.

As described above, in the embodiment, the circuit element 8 of the first oscillator 1A includes the temperature control element 7, and the circuit element 8 of the second oscillator 1B includes the temperature control element 7. Accordingly, the number of components is reduced, and manufacturing of the common package 100 is facilitated.

According to the second embodiment, the same effects as in the first embodiment can also be exhibited.

Third Embodiment

Figure 18:
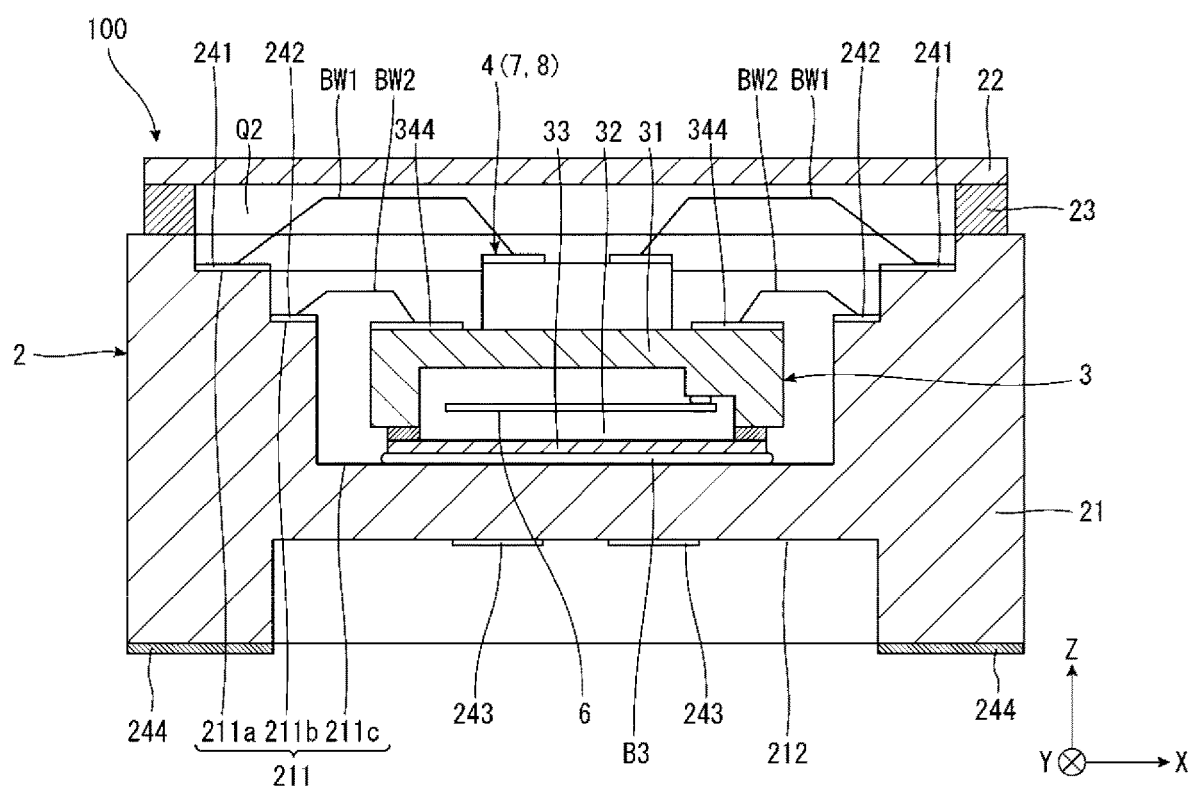
FIG. 18 is a cross-sectional view illustrating a common package according to a third embodiment.

FIG. 18 is a cross-sectional view of a common package according to a third embodiment.

The common package 100 according to the embodiment is the same as the common package 100 of the first embodiment described above except that the circuit element 4 includes the circuit element 8 and the temperature control element 7. In the following description, the common package 100 of the embodiment is described with a focus on differences from the first embodiment described above, and a description of the similar matters is omitted. In the drawing of the embodiment, configurations similar to those of the above-described embodiment will be denoted by the same reference signs.

As illustrated in FIG. 18, in the common package 100 of the embodiment, the circuit element 4 includes the circuit element 8 and the temperature control element 7. In other words, the circuit element 4 has functions of the circuit element 8 and the temperature control element 7. Accordingly, the number of components is reduced, and manufacturing of the common package 100 is facilitated. In the illustrated embodiment, the circuit element 4 is placed at an upper surface of the inner package 3 in order to facilitate transfer of heat generated in the circuit element 4 for heating the resonator element 6 to the resonator element 6.

According to the third embodiment, the same effects as in the first embodiment described above can be exhibited.

Although a method for manufacturing an oscillator according to the present disclosure has been described above based on the illustrated embodiments, the present disclosure is not limited thereto, and a configuration of each part can be replaced with any configuration having a similar function. Any other components may be added to the present disclosure. The embodiments may be combined as appropriate.

What is claimed is:

1. A method for manufacturing oscillators of a plurality of types including a first oscillator and a second oscillator, the method comprising:
   preparing a first container having a first outer base and a first lid, the first outer base having a first monolithic structure, the first outer base having a first surface and a second surface outwardly opposite to each other along a first direction;
   forming a first recess and a second recess in the first and second surfaces, respectively;
   manufacturing the first oscillator, the manufacturing the first oscillator including:
      a first-oscillator first step of mounting a first resonator element and a first circuit element in the first recess of the first outer base, the first circuit element being configured to oscillate the first resonator element to generate a first oscillation signal; and
      a first-oscillator second step of mounting a second resonator element in the second recess of the first outer base, an oscillation frequency of the second resonator element being controlled based on the first oscillation signal;
   preparing a second container having a second outer base and a second lid, the second outer base having a second monolithic structure, the second outer base having a third surface and a fourth surface outwardly opposite to each other along the first direction, wherein the second container has a same size and a same outer shape as the first container such that the first outer base has a same size and a same outer shape as the second outer base;
   forming a third recess and a fourth recess in the third and fourth surfaces, respectively; and
   manufacturing the second oscillator, the manufacturing the second oscillator including:
      a second-oscillator first step of mounting a third resonator element and a second circuit element in the third recess of the second outer base, the third resonator element having a same size as the first resonator element, the second circuit element having a same size as the first circuit element, the second circuit element being configured to oscillate the third resonator element to generate a second oscillation signal; and
      a second-oscillator second step of mounting a fourth resonator element in the fourth recess of the second outer base, an oscillation frequency of the fourth resonator element being controlled based on the second oscillation signal, the oscillation frequency of the fourth resonator element being different from the oscillation frequency of the second resonator element.

2. The method for manufacturing the oscillators according to claim 1, wherein
   in the first-oscillator first step, a first heater circuit configured to heat the first resonator element is further mounted in the first recess of the first container, and
   in the second-oscillator first step, a second heater circuit, which is a same type as the first heater circuit, configured to heat the third resonator element is further mounted in the third recess of the second container.

3. The method for manufacturing the oscillators according to claim 2, wherein
the first circuit element includes the first heater circuit, and
the second circuit element includes the second heater circuit.

4. The method for manufacturing the oscillators according to claim 1, wherein
each of the first resonator element and the third resonator element is an SC-cut quartz crystal resonator element.

5. The method for manufacturing the oscillators according to claim 1, wherein
each of the first resonator element and the third resonator element is an AT-cut quartz crystal resonator element.

6. The method for manufacturing the oscillators according to claim 1, wherein
each of the second resonator element and the fourth resonator element is an AT-cut quartz crystal resonator element.

7. The method for manufacturing the oscillators according to claim 1, wherein
in the first-oscillator second step, a third circuit element configured to oscillate the second resonator element to generate a third oscillation signal is mounted in the second recess of the first container, and a frequency of the third oscillation signal is controlled based on the first oscillation signal, and
in the second-oscillator second step, a fourth circuit element configured to oscillate the fourth resonator element to generate a fourth oscillation signal is further mounted in the fourth recess of the second container, and a frequency of the fourth oscillation signal is controlled based on the second oscillation signal.

8. The method for manufacturing the oscillators according to claim 7, wherein
in the first-oscillator second step, the second resonator element and the third circuit element are mounted in the second recess of the first container in a state of being accommodated in a third container, and
in the second-oscillator second step, the fourth resonator element and the fourth circuit element are mounted in the fourth recess of the second container in a state of being accommodated in a fourth container.

9. The method for manufacturing the oscillators according to claim 1, further comprising:
manufacturing a third oscillator, the manufacturing the third oscillator including:
a third-oscillator first step of mounting a fifth resonator element and a fifth circuit element to a fifth container having a same type as the first container, the fifth resonator element having a same size as the first resonator element, the fifth circuit element having a same size as the first circuit element and being configured to oscillate the fifth resonator element to generate a fifth oscillation signal.

* * * * *